United States Patent [19]
Zook

[11] Patent Number: 6,018,626
[45] Date of Patent: Jan. 25, 2000

[54] ERROR CORRECTION METHOD AND APPARATUS FOR DISK DRIVE EMULATOR

[75] Inventor: Christopher P. Zook, Longmont, Colo.

[73] Assignee: Cirrus Logic, Inc., Fremont, Calif.

[21] Appl. No.: 08/917,497

[22] Filed: Aug. 26, 1997

Related U.S. Application Data

[60] Division of application No. 08/327,681, Oct. 21, 1994, Pat. No. 5,668,976, which is a continuation-in-part of application No. 08/306,918, Sep. 16, 1994, Pat. No. 5,555,516, which is a continuation-in-part of application No. 08/147,758, Nov. 4, 1993, abandoned.

[51] Int. Cl.$^7$ ........................................ G06F 9/455
[52] U.S. Cl. ........................................ 395/500.45
[58] Field of Search ............... 395/500, 182.05; 371/40.12, 30, 40.15; 364/737

[56] References Cited

U.S. PATENT DOCUMENTS

| | | |
|---|---|---|
| 4,642,759 | 2/1987 | Foster . |
| 4,718,064 | 1/1988 | Edwards et al. . |
| 5,062,042 | 10/1991 | Binkley et al. . |
| 5,077,736 | 12/1991 | Dunphy, Jr. et al. ............... 395/182.05 |
| 5,077,737 | 12/1991 | Leger et al. ......................... 395/182.04 |
| 5,131,089 | 7/1992 | Cole . |
| 5,218,691 | 6/1993 | Tuma et al. .............................. 395/500 |
| 5,289,477 | 2/1994 | Lenta et al. ............................. 371/37.7 |
| 5,291,584 | 3/1994 | Challa et al. . |
| 5,297,148 | 3/1994 | Harari et al. . |
| 5,359,726 | 10/1994 | Thomas . |
| 5,379,305 | 1/1995 | Weng ...................................... 371/41 |
| 5,404,361 | 4/1995 | Casorso et al. ....................... 371/40.12 |
| 5,418,752 | 5/1995 | Harari et al. ............................ 365/218 |
| 5,428,630 | 6/1995 | Weng et al. ............................ 371/40.1 |
| 5,430,859 | 7/1995 | Norman et al. . |
| 5,438,674 | 8/1995 | Keele et al. . |
| 5,459,742 | 10/1995 | Cassidy et al. . |
| 5,459,850 | 10/1995 | Clay et al. . |
| 5,473,765 | 12/1995 | Gibbons et al. . |
| 5,479,633 | 12/1995 | Wells et al. ............................. 395/430 |
| 5,555,402 | 9/1996 | Tuma et al. ............................. 395/500 |

FOREIGN PATENT DOCUMENTS

| | | |
|---|---|---|
| 0 107 038 A2 | 5/1984 | European Pat. Off. . |
| 94/19807 | 9/1994 | WIPO . |

OTHER PUBLICATIONS

"Byte–Wide ECC/CRC Code and Syndrome Calculator", IBM Technical Disclosure Bulletin, vol. 29, No. 5, Oct. 1986, pp. 2143–2145.

*Primary Examiner*—Kevin J. Teska
*Assistant Examiner*—Dan Fiul
*Attorney, Agent, or Firm*—H. Warren Burnam, Jr.; Dan A. Shifrin

[57] ABSTRACT

An error correction system (10) is provided for correcting up to two bits per sector stored in a solid state non-volatile memory (12) which emulates a disk drive. The error correction system (10) includes an ECC/remainder generator (100), a bank of remainder registers (102), and a calculation circuit (104), all under supervision of a controller (106). During a write-to-memory operation, error correction system (10) generates ECC bytes for storage in the memory (12). In a write operation, an entire sector acquired from memory (12) is used to generate ECC check remainder bytes $REM_0$–$REM_3$. The check remainder bytes $REM_0$–$REM_3$ are utilized to generates syndromes $S_1$, $S_3$ and a factor $S_B$, the syndromes in turn being used to obtain either one or two error location positions ($\alpha^{L1}$, $\alpha^{L2}$). The mathematical calculation circuit (104) not only generates the syndromes $S_1$, $S_3$ and factor $S_B$, as well as the error location positions ($\alpha^{L1}$, $\alpha^{L2}$), but also generates the addresses of the bit errors in the sector (L1-64 [complemented], L2-64 [complemented].

21 Claims, 13 Drawing Sheets

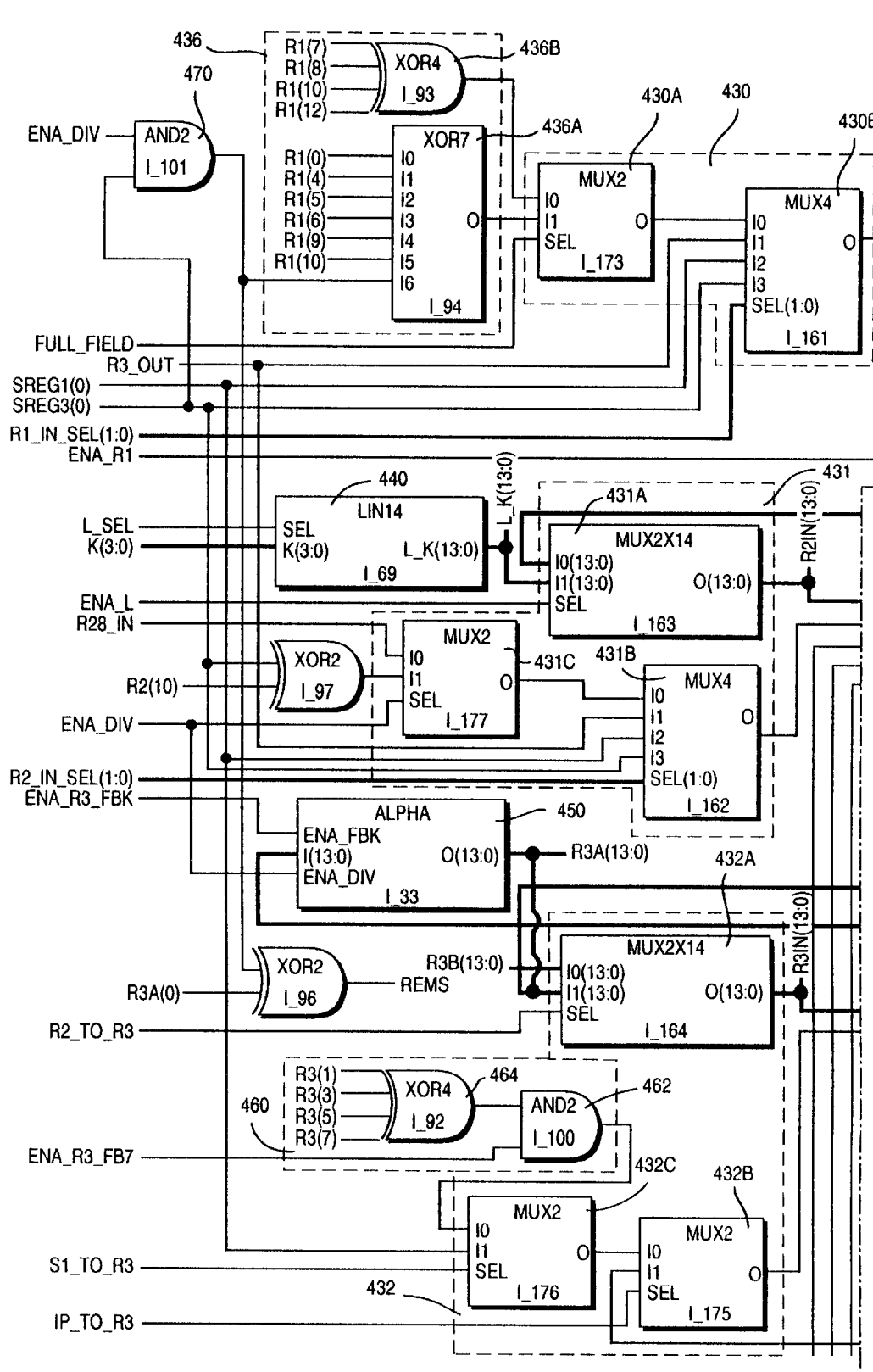
FIG. 5A1

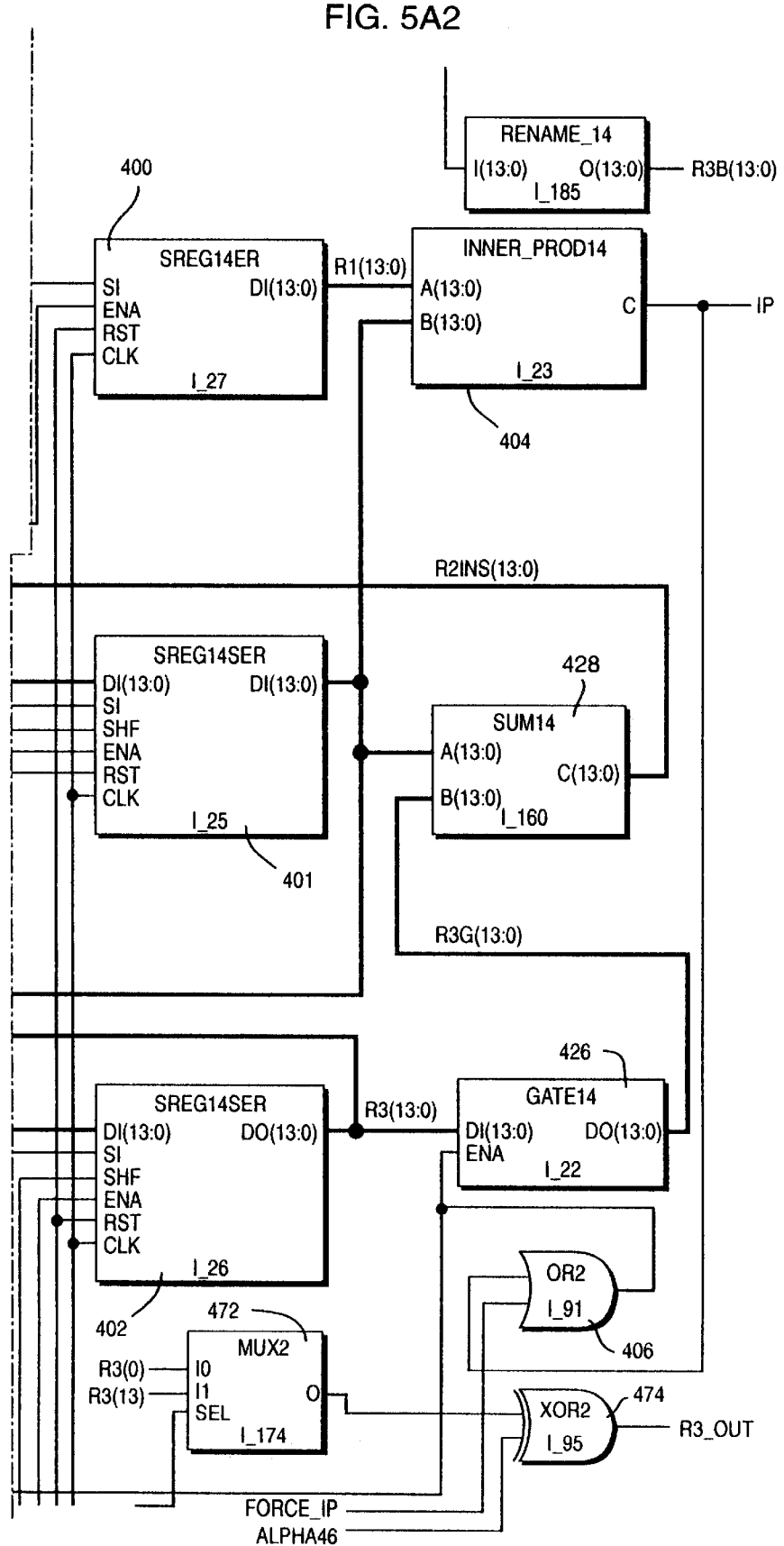
FIG. 5A2

ERROR CORRECTION METHOD AND APPARATUS FOR DISK DRIVE EMULATOR

CROSS-REFERENCES TO RELATED APPLICATIONS

This is a divisional of application Ser. No. 08/327,681, filed Oct. 21, 1994, now U.S. Pat. No. 5,668,976, which is a continuation-in-part of application Ser. No. 08/306,918 filed Sep. 16, 1994, now U.S. Pat. No. 5,555,516, which in turn is a continuation-in-part of application Ser. No. 08/147,758 filed Nov. 4, 1993, (abandoned).

BACKGROUND

1. Field of Invention

The present invention relates to computer technology and, more specifically, to a solid state disk drive emulation device with improved error correction.

2. Related Art and Other Considerations

Computer systems commonly employ magnetic hard disk drives for mass storage. Magnetic disk drives, however, are bulky, require sophisticated read/write electronics, and use high precision moving mechanical parts subject to reliability problems. Further, disk drives require a significant amount of power and are, therefore, less desirable for use in portable computers.

The dramatic increase in storage density of non-volatile solid state memory devices, such as Flash EEproms, allows solid state disk drives to emulate the magnetic disk drives for mass storage in computer systems. Similar to magnetic disk drives, nonvolatile solid state disk drives retain data even after the power is shut down. Flash memory is also inexpensive and more reliable relative to magnetic disk drives because there are no moving parts. Further, solid state disk drives use less sophisticated read/write electronics and consume less power. Commonly, a PCMCIA card incorporates the Flash EEproms into a compact and portable device. Therefore, solid state disk drives are more suited for particular applications such as portable computers.

Obviously, there are drawbacks to using solid state disk which prevent magnetic disk drives from becoming obsolete. For instance, storing extremely large amounts of data (several hundred megabytes) is far less expensive in magnetic disk drives than in solid state drives. Also, solid state memory, such as Flash EEproms, have a limited lifetime and can be unreliable after a certain number of erase/write cycles (typically 1,000 to 10,000 cycles). A further drawback is that errors arising from defective memory cells, or discharged memory cells, can render the solid state disk drive less reliable.

One method for overcoming errors caused by defective memory cells is disclosed in U.S. Pat. No. 5,297,148 issued to Harari et al. The Harari patent discloses a method for replacing a defective memory cell with a redundant cell. A defect pointer which connects the address of the defective cell to the substitute cell is stored in a defect map. Every time the defective cell is accessed, its bad data is replaced by the good data from the substitute cell. This method, however, is undesirable in that the defect mapping is performed only during manufacturing and does not compensate for cells that fail during normal operation. Further, the rate of failures in Flash EEprom devices increases with increasing erase/write cycling.

Conventional error correcting (ECC) for magnetic disk drives is typically employed to compensate for errors caused by cells that become defective over time and for soft errors caused by discharged cells. The magnetic disk ECC systems, however, are optimized for errors that are associated with magnetic recording. Errors in magnetic recording are typically burst errors (several sequential bits) of varying length caused by a defect in the magnetic media. Conventional ECC systems employ complex error correcting algorithms to correct these errors. Consequently, implementing the algorithms requires complex circuitry that consumes more power and expense. Further, the significant amount of latency inherent in the complex algorithms for detecting and correcting errors associated with magnetic recording can slow the overall access time of the device.

The errors associated with solid state disk drives are significantly different than magnetic disk drives. Normally, solid state disk drives exhibit a one or two bit error per sector. The errors are commonly caused by a defective cell (hard error) or a cell that becomes discharged over time (soft error). It is inefficient to apply the complex error correcting algorithms for correcting errors associated with magnetic media in order to correct the one or two bit errors per sector commonly associated with Flash memory.

It is, therefore, a general object of the present invention to provide an improved Flash EEprom solid state disk drive that can serve as a non-volatile storage device in a computer system. A further object is to minimize the complexity and latency in correcting the types of one or two bit errors per sector commonly associated with Flash EEprom memory used as the storage element in the solid state disk drive.

SUMMARY

An error correction system (10) is provided for correcting up to two bits per sector stored in a solid state non-volatile memory (12) which emulates a disk drive. The error correction system (10) includes an ECC/remainder generator (100), a bank of remainder registers (102), and a calculation circuit (104), all under supervision of a controller (106). During a write-to-memory operation, error correction system (10) generates ECC bytes for storage in the memory (12). In a write operations, an entire sector acquired from memory (12) is used to generate ECC check remainder bytes $REM_0$–$REM_3$. The check remainder bytes $REM_0$–$REM_3$ are utilized to generates syndromes $S_1$, $S_3$ and a factor $S_B$, the syndromes in turn being used to obtain either one or two error location positions ($\alpha^{L1}$, $\alpha^{L2}$). The mathematical calculation circuit (104) not only generates the syndromes $S_1$, $S_3$ and factor $S_B$, as well as the error location positions ($\alpha^{L1}$, $\alpha^{L2}$), but also generates the addresses of the bit errors in the sector (L1-64 [complemented], L2-64 [complemented].

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 5A is a schematic block diagrammatic view of a first portion of a calculation circuit included in the error correction system of FIG. 2.

DETAILED DESCRIPTION OF THE DRAWINGS

Figure 1:
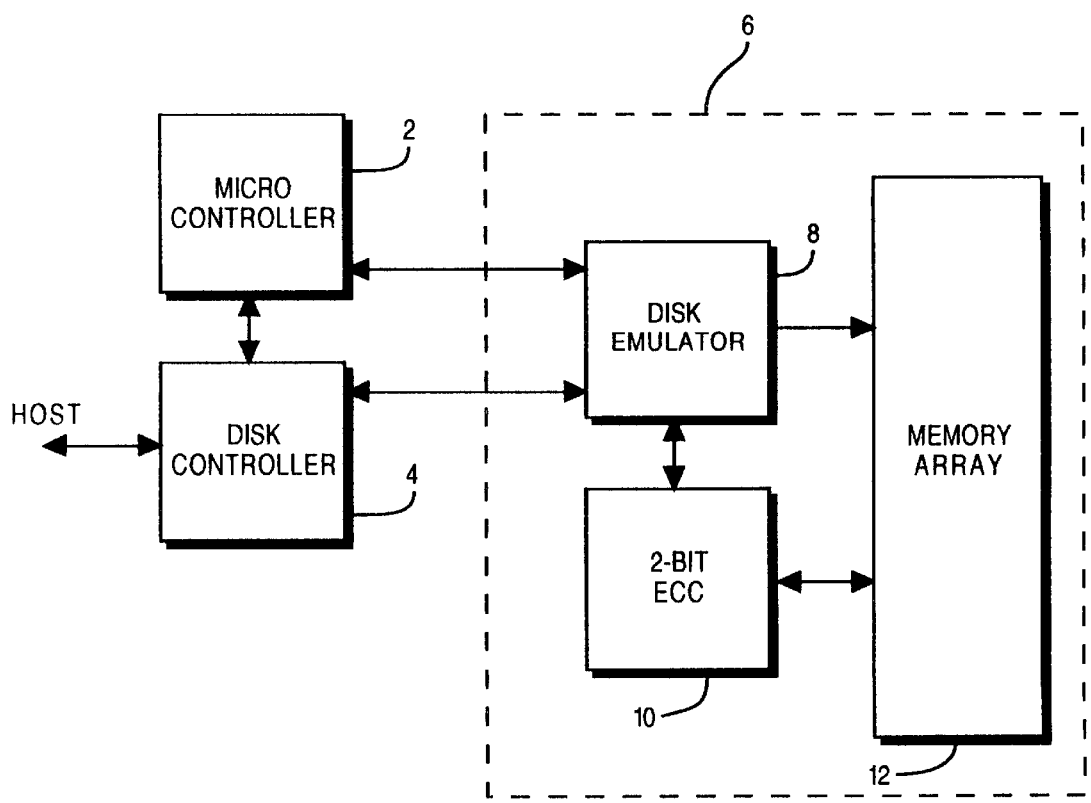
FIG. 1 is an overview of a solid state disk drive comprising a micro-controller, disk controller, disk emulation system, two bit burst error correcting system, and memory array.

FIG. 1 shows an overview of the solid state disk drive 6 of the present invention. A conventional disk controller 4 provides the interface between the solid state drive and a host system. The disk controller 4 can be any suitable controller, including, for example, type CL-SH350 available from Cirrus Logic, Inc. of Milpitas, Calif. A micro-controller 2 establishes the initial operating parameters for the disk controller 4 and a disk emulator 8. The micro-controller 4 also coordinates disk based commands and data transfers to and from the host. A disk emulator 8 provides the disk control signals necessary to emulate a magnetic disk drive. It accepts typical control signals from the disk controller 4 and micro-controller 2, such as track and sector numbers to read/write, and process the commands to read/write the requested data from/to a memory array 12 of Flash EEprom devices. A one or two bit error correcting system 10 detects and corrects errors caused by defective or discharged memory cells. For a complete discussion on the control and emulation of a solid state disk drive, refer to U.S. Pat. No. 5,291,584 entitled "Methods and Apparatus For Hard Disk Emulation", issued to Challa et al, the contents of which are herein incorporated by reference.

Figure 9:
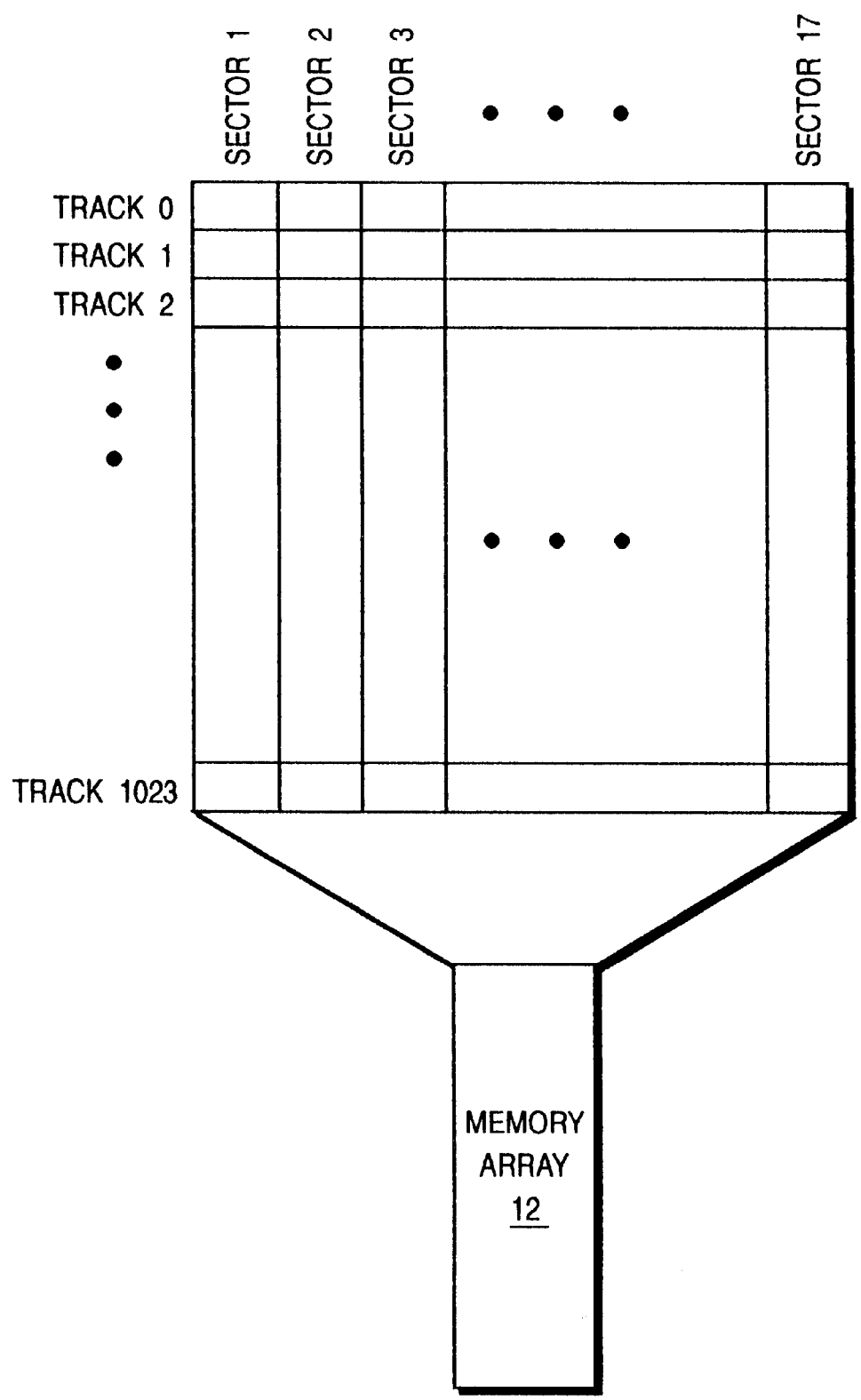
FIG. 9 shows the data format for the memory array comprised of rows of tracks and columns of sectors.

In solid state disk drives, the data format of the memory array 12 is typically formatted into an array of track rows and sector columns as shown in FIG. 9. The track rows and sector columns represent the concentric tracks on a magnetic disk. As previously mentioned, defective or discharged cells in a Flash EEprom memory array can cause one or two bit errors per sector. Error correcting system 10 comprises an error correcting algorithm particularly suited to correcting these one or two bit errors.

Figure 2:
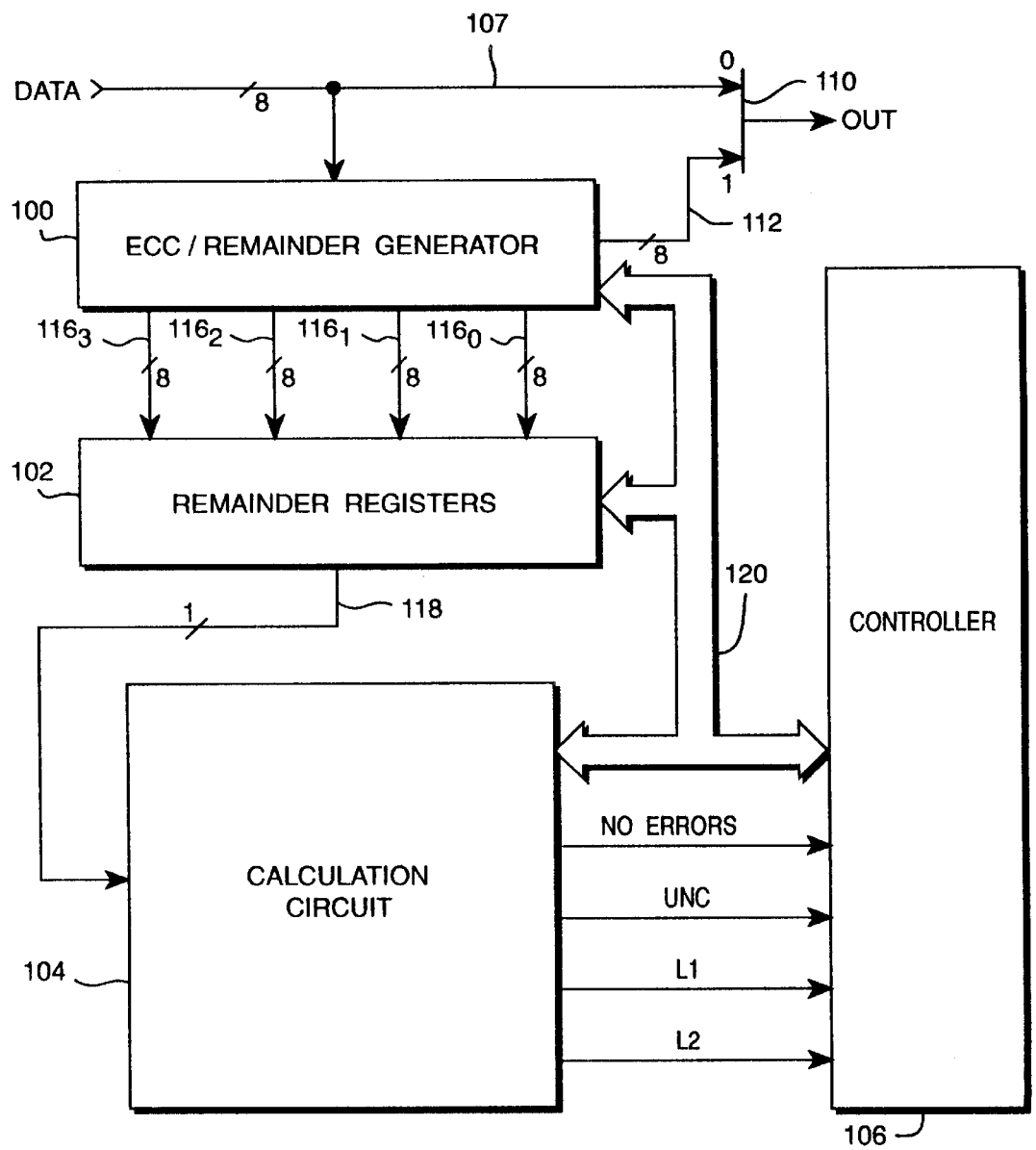
FIG. 2 is a schematic block diagrammatic view of an error correction system included in solid state disk drive of FIG. 1.

FIG. 2 shows that error correction system 10 includes an ECC/remainder generator 100; a bank of remainder registers 102; a calculation circuit 104; and, a controller 106. Eight-bit data bytes on line 107 are applied both to ECC remainder generator 100 and to a input terminal 0 of MUX 110. ECC/remainder generator is discussed in more detail with reference to FIG. 3. As seen hereinafter, ECC/remainder generator 100 generates four eight-bit ECC bytes which are output on line 112 to input terminal 1 of MUX 110.

It is again mentioned that error correction system 10 must locate up to two bits of error in the 512 byte sector. Since a 14 bit polynomial is necessary to locate a one bit error in such situation, two 14-bit polynomials are necessary to correct two one-bit errors. Since the product of 2×14 =28 is not a multiple of 8, 32 is chosen for the length of the code generator polynomial and accordingly for various registers hereinafter described, particularly with reference to calculator circuit 104. Thus, the code generator polynomial is the product of two 14-bit polynomials and a 4-bit polynomial as follows:

$$G(X) = (x^{14} + x^{10} + x^9 + x^6 + x^5 + x^4 + 1)(x^{14} + x^6 + x^5 + x^2 + 1)(x^4 + 1)$$
$$= (x^{32} + x^{27} + x^{24} + x^{23} + x^{22} + x^{15} + x^{12} + x^7 + x^2 + 1)$$

The generation of the 4-bit polynomial results in generation of a four bit factor $S_B$ which has significance for checking the operation of error correction system 10.

Moreover, error correction system 10 employs a bit-oriented code, although data is inputted thereto and ECC bytes outputted therefrom in byte form.

ECC/remainder generator 100 is connected by four remainder output buses 116 to the bank of remainder registers 102. The bank of remainder registers 102 is discussed in more detail with reference to FIG. 4. A one-bit output line 118 connects the bank of remainder registers 102 with calculation circuit 104. Calculation circuit 104 is discussed in more detail with reference to FIG. 5A and FIG. 5B.

Controller 106 supervises and sequences the operations of error correction system 10, and accordingly is connected by control bus 120 to each of ECC/remainder generator 100; the bank of remainder registers 102; and calculation circuit 104. Although not necessarily shown in detail herein, it should be understood that various select signals to MUXes and the timing of operations discussed hereinafter is facilitated by control lines which are generally indicated as forming part of control bus 120.

A function of calculation circuit 104 is to locate errors of as many as two bits in a sector of data applied to error correction system 10. Accordingly, calculation circuit 104 outputs several signals to controller 106, including a signal NO ERRORS; a signal UNC (meaning uncorrectable sector); a signal L1-64 [complemented] (which provides the address of a first error bit in the sector); and, a signal L2-64 [complemented] (which provides the address of a second error bit in the sector). As hereinafter discussed, the error bit locator values L1 and L2, referenced generically as "L", are twelve bit values, the higher order nine bits being used for locating the erroneous byte in the sector; the lower order three bits being used for locating the erroneous bit in the erroneous byte.

STRUCTURE: ECC REMAINDER GENERATOR

As will be described hereinafter, ECC/remainder generator 100 generates ECC bytes during a write operation and generates ECC remainder bytes during a read operation. In the read operation, the ECC remainder bytes are used to generates syndromes S1 and $S_3$, which in turn are used to determine the error bit locator values L1 and L2.

Figure 3:
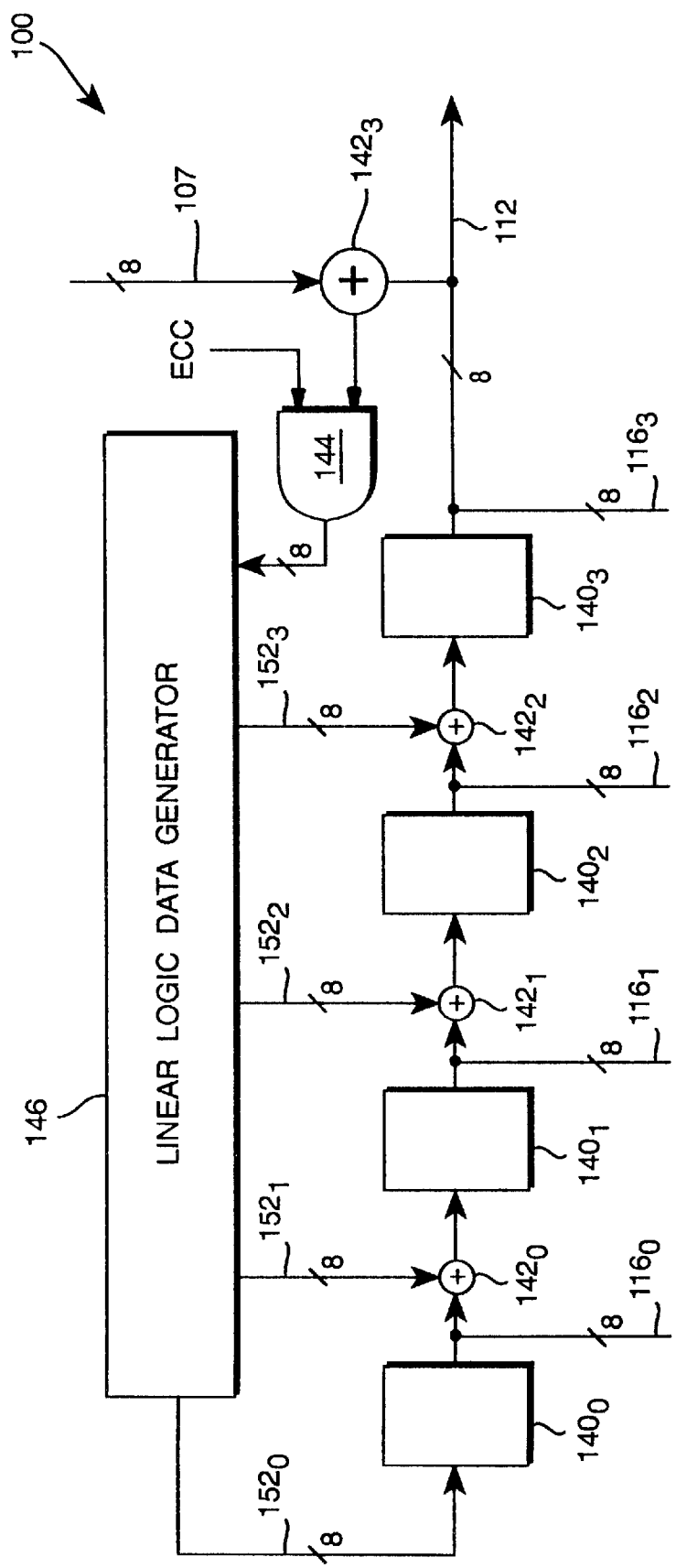
FIG. 3 is a schematic block diagrammatic view of an ECC/remainder generator included in the error correction system of FIG. 2.

ECC/remainder generator 100, as shown in more detail in FIG. 3, includes four ECC/remainder registers $140_0$–$140_3$; a set of adders 142; AND gate 144; and, linear logic data generator 146. A first terminal of adder $142_3$ is connected to incoming data line 107; a second input terminal of adder $142_3$ is connected to an output terminal of register $140_3$. An output terminal of adder $142_3$ is connected to a first input terminal of AND gate 144, a second input of AND gate 144 being connected to receive a signal ECC from controller 106. An output terminal of AND gate 144 is connected to an input terminal of linear logic data generator 146.

Linear logic data generator 146 is a set of logic components including XOR gates for outputting specific output signals on buses 152 in accordance with the input signal received from AND gate 144. TABLE 1 shows how the output signals for buses 152 can be deduced in view of the input signal to linear logic data generator 146. The first set of eight columns of TABLE 1 are used to generate the output signal for bus $152_3$, the second set of eight columns of TABLE 1 are used to generate the output signal for bus $152_2$, the third set of eight columns of TABLE 1 are used to generate the output signal for bus $152_1$, the fourth set of eight columns of TABLE 1 are used to generate the output signal for bus $152_0$. The first column of each set corresponds to the highest order bit of the output signal, the last column of each set corresponding to the lowest order bit of the output signal. A "1" in each column shows the bit positions of the input signal which are to be XORed together to produce the output signal. For example, for the output signal on bus $152_3$, bit 7 of the output signal is produced by XORing bits 4 and 7 of the input signal. The man skilled in the art can well use TABLE 1 in order to construct a circuit which produces the desired output of TABLE 1.

Linear logic data generator 146 has four output buses $152_0$–$152_3$. Each linear logic output bus 152 is an eight bit bus. Linear logic output buses $152_1$–$152_3$ are connected to first input terminals of adders $142_0$–$142_2$, respectively. Linear logic output bus $152_0$ is connected to an input terminal of ECC/remainder register $104_0$.

An output terminal of each of registers $140_0$–$140_3$ are connected to second input terminals of respective adders $142_0$–$142_3$, respectively. In addition, output terminals of registers $140_0$–$140_3$ are connected to remainder output buses $116_0$–$116_3$, respectively. Output terminals of adders $142_0$–$142_2$ are connected to input terminals of registers $140_1$–$140_3$, respectively. Thus, registers 140 are connected to form a shift register so that (after ECC generation) ECC bytes generated therein can be shifted out on line 112 to MUX 110 for transmission to memory 12. In this regard, as hereinafter discussed, ECC/remainder generator 100 generates a first ECC byte $ECC_0$ in register $140_0$, a second ECC byte $ECC_1$ in register $140_1$, a third ECC byte $ECC_2$ in register $140_2$, and a fourth ECC byte $ECC_3$ in register $140_3$.

STRUCTURE: REMAINDER REGISTERS

Figure 4:
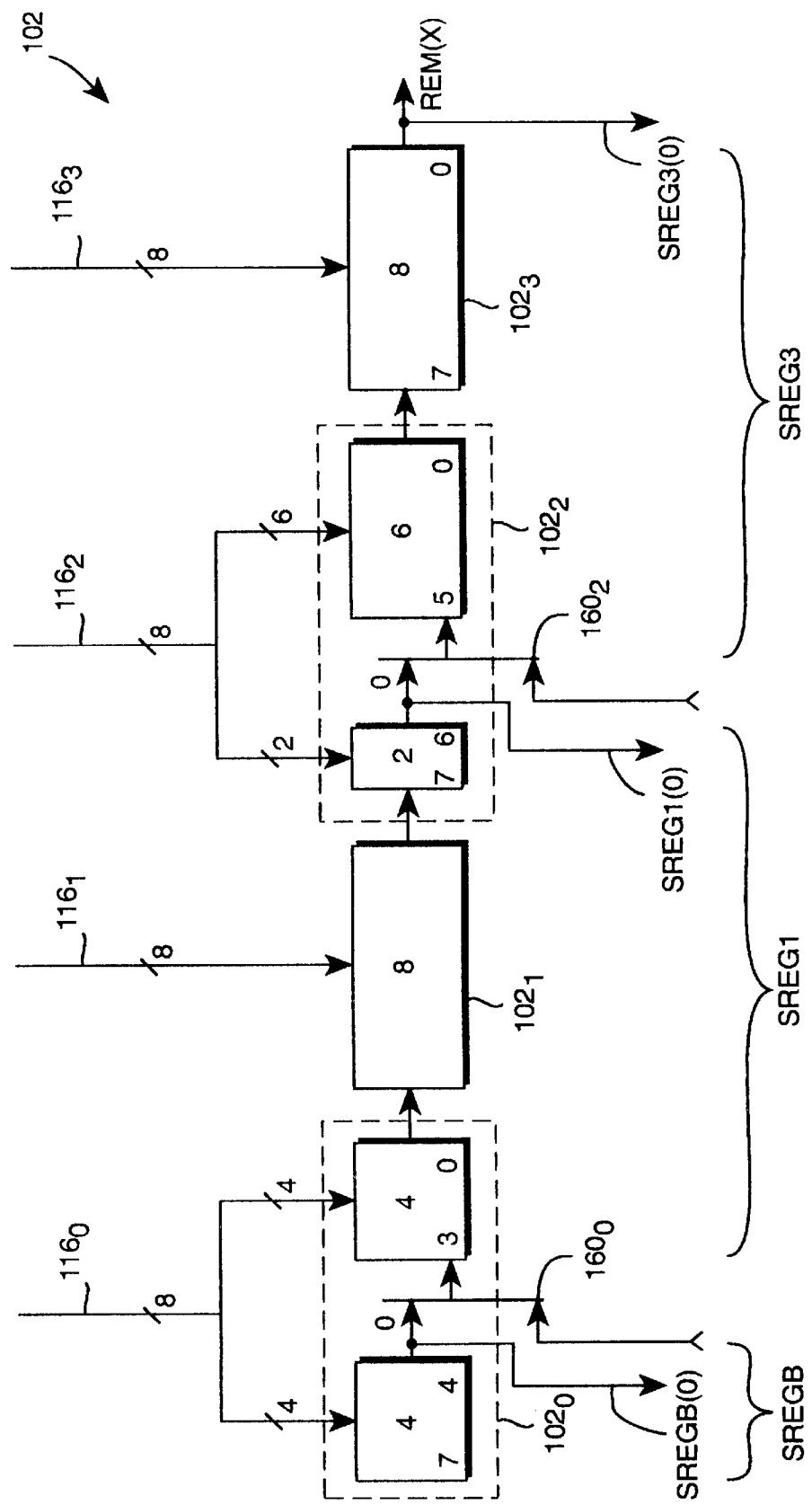
FIG. 4 is a schematic block diagrammatic view of a bank of remainder registers included in the error correction system of FIG. 2.

Bank 102 of remainder registers is shown in more detail in FIG. 4. More specifically, bank 102 includes four 8-bit shift registers $102_0$–$102_3$, registers $102_0$ and $102_2$ being framed by broken lines for sake of illustration in FIG. 4. Register $102_2$ is conceptualized as having a six bit lower order component and a two bit higher order component. A MUX $160_2$ feeds bit 5 of the lower order component of register $102_2$, an input terminal 0 of MUX $160_2$ being connected to bit 6 of register $102_2$. Register $102_0$ is conceptualized as having a four bit lower order component and a four bit higher order component. A MUX $160_0$ feeds bit 3 of the lower order component of register $102_0$, an input terminal 0 of MUX $160_0$ being connected to bit 4 of register $102_0$.

Remainder output bus $116_3$ loads (in parallel) an eight bit value into remainder register $102_3$. The six lower order bits of remainder output bus $116_2$ are connected to load (in parallel) the (six bit) lower order component of remainder register $102_2$. The two higher order bits of remainder output bus $116_2$ are connected to load (in parallel) the (two bit) higher order component of remainder register $102_2$. Remainder output bus $116_1$ loads (in parallel) an eight bit value into remainder register $102_1$. The four lower order bits of remainder output bus $116_0$ are connected to load (in parallel) the (four bit) lower order component of remainder register $102_0$. The four higher order bits of remainder output bus $116_0$ are connected to load (in parallel) the (four bit) higher order component of remainder register $102_0$.

As grouped in the manner shown at the bottom of FIG. 4, the bank 102 of remainder registers are also termed the SREG3, SREG1, and SREGB registers. Register SREG3 includes register $102_3$ and the six lower order bits of register $102_2$; register SREG1 includes the two higher order bits of register $102_2$, all bits of register $102_1$, and the four lower order bits of register $103_0$; register SREGB is the four higher order bits of register $102_0$. SREG1 is particularly noted for its ultimate storage of syndrome $S_1$; register SREG3 for its storage of syndrome $S_3$; and register SREGB for its storage of a factor $S_B$. For feeding out of values stored in SREGB, SREG1, and SREG3, a line SREG(0) is connected to bit 4 of register $102_0$; a line SREG1(0) is connected to bit 6 of register $102_2$; and a line SREG3(0) is connected to bit 0 of register $102_3$.

STRUCTURE: CALCULATION CIRCUIT

Calculation circuit 104, shown in more detail in FIG. 5A, includes three primary working registers, particularly register 400 (also known as register R1); register 401 (also known as register R2); and register 402 (also known as register R3). Each of registers 400, 401, and 402 is a fourteen bit shift register, although not all fourteen bits are necessarily utilized in every operation.

As will be seen hereinafter, calculation circuit 104 performs numerous mathematical operations upon terms stored in registers 400, 401, and 402. As one example, circuit 104 frequently performs multiplication of a first term (stored in register 400 in β basis representation) and a second term (stored in register 401 in α basis representation), and outputs the product into register 402 (in β basis representation). As another example, linear transformations are performed using the contents of registers 400 and 401. Yet further, circuit 104 performs basis conversion and inversions.

Further details of calculation circuit 104 are described below and also understood from a kindred circuit disclosed in U.S. patent application Ser. No. 08/306,918 (attorney docket 1777-11) of Zook filed on Sep. 16, 1994, entitled MULTIPURPOSE ERROR CORRECTION CALCULATION CIRCUIT, incorporated herein by reference.

Calculation circuit 104 includes an inner product circuit 404 which takes the inner product of registers 400 and 401 and outputs a serial bit signal IP. Inner product signal IP is transmitted through OR gate 406 for application as an enable signal to a bank 426 of AND gates. Each bit of register 402 is connected to an input terminal of a corresponding AND gate in bank 426. Output terminals of AND gates included in bank 426 are connected to "B" input terminals of respective adders in adder bank 428. Bits of register 401 are connected to corresponding "A" input terminals of adder bank 426.

Registers 400, 401, and 402 have switching systems 430, 431, and 432, respectively for selectively loading of data. Switching of data (always serial) into register 400 is controlled by switching system 430. Switching system 430 includes MUXes 430A and 430B. An output terminal of MUX 430B is connected to a data input terminal of register 400. One data input terminal of MUX 430B is connected to an output terminal of MUX 430A. Other data input terminals of MUX 430A are connected to the lines FULL_FIELD, R3_OUT, SREG1 (0) [see FIG. 4], and SREG3 (0) [see FIG. 4].

The data input terminals of MUX 430A are connected to a feedback system 436 which provides feedback multiplication for either a full field value or a subfield value. In particular, feedback system 436 includes XOR gate 436A for multiplying register 400 by a full field feedback constant and XOR gate 436B for multiplying register 400 by a subfield constant. Bit positions XORed by gates 436A and 436B depend on the field generator polynomial utilized. In the illustrated example, the full field generator polynomial is $x^{14}+x^{10}+x^9+x_6+x^5+x^4+1$ and the subfield generator polynomial is $x_7+x^5+x^3+x+1$. Accordingly, bits 0, 4, 5, 6, 9, and 10 are connected to XOR gate 436A; bits 7, 8, 10, and 12 are connected to XOR gate 436B. The output terminal of XOR gate 436A is connected to a first data input terminal of MUX 430A; the output terminal of XOR gate 436B is connected to a second data input terminal of MUX 430A.

Data is loaded into register 401 via switching system 431. Switching system 431 includes parallel-load MUX 431A; serial-load MUX 431B; and pre-MUX 431C. Output terminals of parallel-load MUX 431A are connected to respective bits of register 401. A serial input pin of register 401 is connected to an output terminal of serial-load MUX 431B. Selectable lines connected to input terminals of serial-load MUX 431B include an output line from MUX 431C; line R3_OUT; line SREG1(0) [see FIG. 4]; and, line SREG3(0) [See FIG. 4].

Calculation circuit 104 also includes a LIN 440. In the illustrated embodiment, LIN 440 is a ROM having lookup tables stored therein, including look up tables for performing a linear combination for "y" as hereinafter described and look up tables for finding values for use in a linear combination operation which obtains subfield elements $x_1$, $x_0$ of an error pointer. Whether LIN 440 is to output values for performing the linear combination for "y" or the sub-field values is dependent upon a select signal applied thereto from controller 106. A fourteen bit output terminal of LIN 440 is parallel connected to one of the input terminals of parallel-load MUX 431A.

As mentioned above, one data input terminal of parallel-load MUX 431A is connected to output terminals of LIN 440. A second data input terminal of MUX 431A is connected to receive the parallel output of adder bank 428.

Data is loaded into register 402 via switching system 432. Switching system 431 includes parallel-load MUX 432A; serial-load MUX 432B; and pre-MUX 432C. A first data input terminal of MUX 432A is connected to bits of register 402; a second data input terminal of MUX 432A is connected to an output terminal of multiplier circuit 450.

Figure 6:
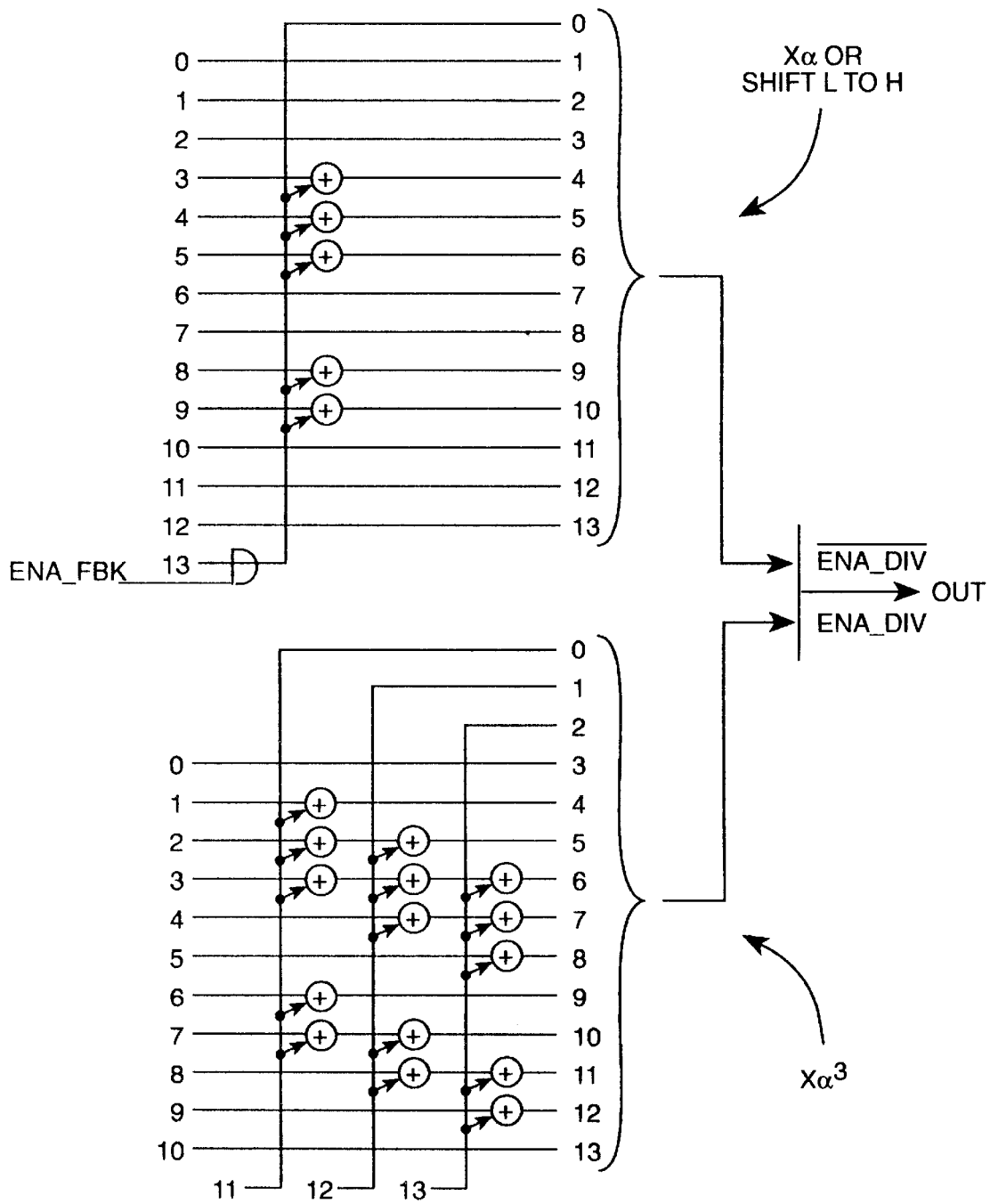
FIG. 6 is a schematic block diagrammatic view of a multiplier circuit included in the calculation circuit of FIG. 5A.

Multiplier circuit 450 can selectively be involved in a division operation; be involved in a basis conversion; or multiply a value input thereto (parallel loaded from register 402) either by $\alpha$ or $\alpha^3$. The structure of multiplier circuit 450 is understood from FIG. 6. The upper portion of FIG. 6 shows how the input and output terminals of multiplier are connected for multiplication by $\alpha$; the lower portion of FIG. 6 shows how the input and output terminals of multiplier are connected for multiplication by $\alpha^3$. Multiplication by $\alpha^3$ occurs during syndrome generation, for which reason control signal ENA_DIV applied during syndrome generation results in the product with $\alpha^3$ being outputted via an internal MUX. An output terminal of multiplier circuit 450 is connected to an input terminal of MUX 432A.

A serial load input terminal of register 402 is connected to an output terminal of serial-load register 432B. A first input terminal of MUX 432B is connected to an output terminal of MUX 432C. A second input terminal of MUX 432B is connected to the output terminal of OR gate 406. A first input terminal of pre-MUX 432C is connected to a feedback circuit 460; a second input terminal of pre-MUX 432C is connected to line SREG1(0) [see FIG. 4].

Feedback circuit 460 includes AND gate 462 and XOR gate 464. XOR gate 646 is connected to bits 1, 3, 6, and 7 of register 402. An output terminal of XOR gate 464 is connected to a first input terminal of AND gate 462. A second input terminal of AND gate 462 is connected to an enable signal.

Also shown in FIG. 5A is a syndrome generation AND gate 470 which has a first terminal connected to line SREG3 (0) and a second terminal connected to receive a syndrome enabling control signal ENA_DIV. An output terminal of AND gate 470 is connected to an input terminal of XOR gate 436A.

Bits 0 and 13 of register 402 are connected to first and second data input terminals of MUX 472. An output terminal of MUX 472 is connected to a first input terminal of XOR gate 474. A second input terminal of XOR gate 474 is connected to receive a control signal. An output terminal of XOR gate 474 is connected to line R3_OUT, which is connected to registers 400 and 401 via MUXes 430B and 431B, respectively.

Figure 5B:
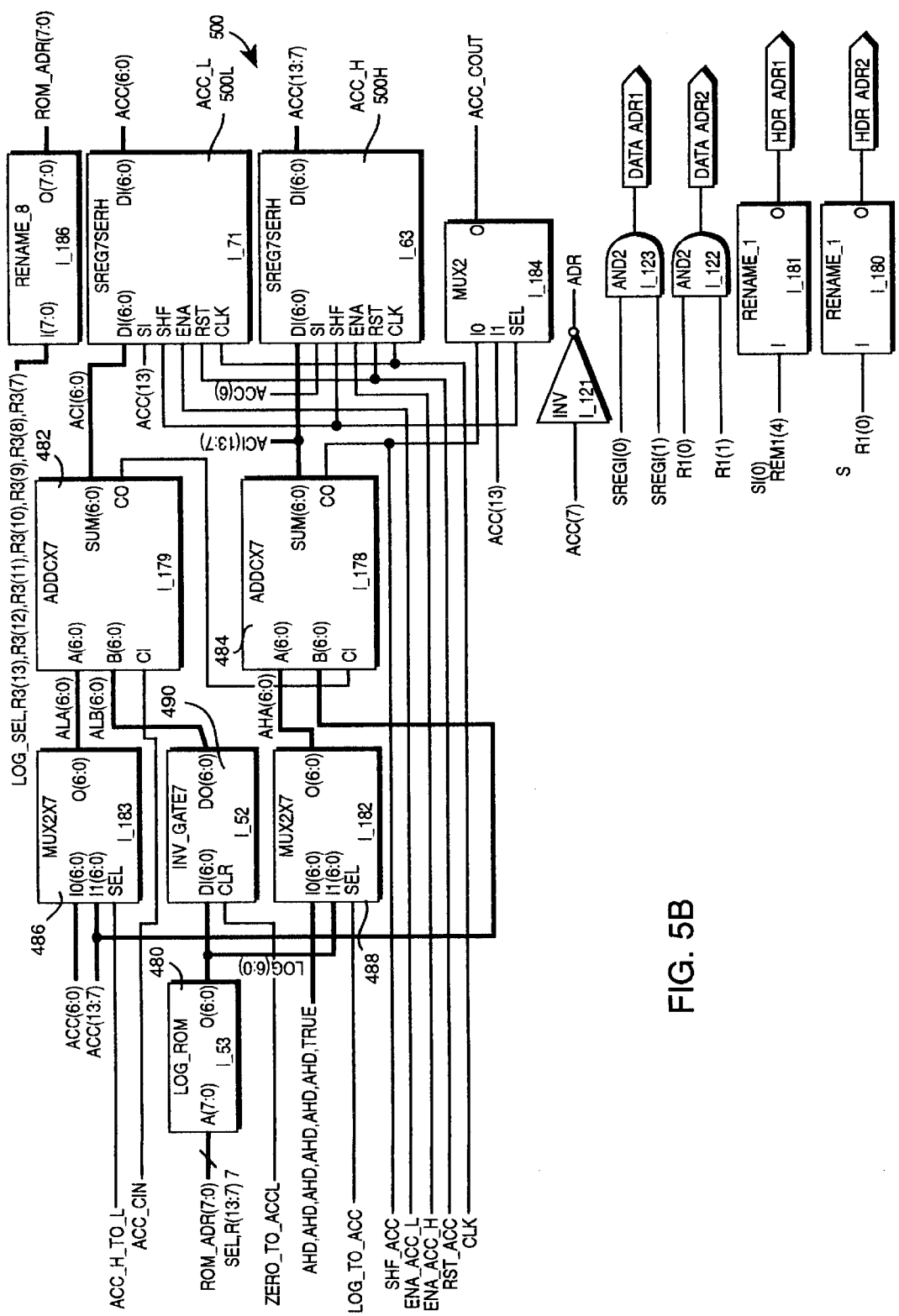
FIG. 5B is a schematic block diagrammatic view of a second portion of a calculation circuit included in the error correction system of FIG. 2.

As shown in FIG. 5B, calculation circuit 104 further includes a LOG ROM 480; adders 482 and 484; adder input MUXes 486 and 488; inversion gate 490; and, an accumulator register 500 including lower order accumulator 500L and higher order accumulator 500H. LOG ROM 480 is parallel loaded with data from bits 7–13 of register 402. A seven bit output terminal of LOG ROM 480 is connected to a first input terminal of MUX 488 and to inversion gate 490. An output terminal of MUX 488 is connected to a B input terminal of adder 484. A second input terminal of adder 484 is connected to an output terminal of higher order accumulator 500H. The output terminal of higher order accumulator 500H is also connected to a first input terminal of MUX 486; a second input terminal of MUX 486 being connected to an output terminal of lower order accumulator 500L. An output terminal of MUX 486 is connected to a first input terminal of adder 482, a second input terminal of adder 482 being connected to an output terminal of inversion gate 490. An output terminal of adder 482 is connected to a data input terminal of lower order accumulator 500L. An output terminal of adder 484 is connected to a data input terminal of higher order accumulator 500H. A "carry" output pin of adder 482 is connected to a "carry in" input pin of adder 484.

OPERATION: OVERVIEW

Error correction system 10 is involved in both write and read operations (e.g., operations for storing information to non-volatile memory 12 and for accessing information stored in non-volatile memory 12). In the writing of a sector to memory 12, 512 data bytes and up to 4 header bytes are transmitted to error correction system 10. Using the 512 data bytes and up to 4 header bytes for a sector, error correction system 10 generates 4 ECC bytes. In reading stored information from non-volatile memory 12, ECC/remainder generator 100 of error correction system 10 uses the 512 data bytes, 4 header bytes, and 4 ECC bytes to generate an ECC check remainder. The ECC check remainder is used by calculation circuit 104 to generate syndromes $S_1$ and $S_3$. The syndromes $S_1$, $S_3$ are, in turn, used to determine if the sector is error-free, if whether one or two error bits reside in the sector, and either one or two error bit positions (L1-64 [complemented] and L2-64[complemented]) in the sector.

OPERATION: WRITE OPERATION

In a write operation, 512 bytes of data (preceded by up to 4 bytes of header) are applied on line 107 both to terminal 0 of MUX 110 and to error correction system 10. The data (preceded by up to four header bytes) is applied to MUX 110 is transmitted to non-volatile memory 12.

When a new sector is applied on line 107 to error correction system 10, all registers including registers 140 are cleared (see step 7-1 in FIG. 7) and a ECC-generation enable signal ECC is sent to gate 144 by controller 106 (step 7-2).

Step 7-3 shows header bytes and data bytes being applied to error correction system 10, specifically to the first input terminal of adder $142_3$ (see FIG. 3). The input data is treated as a binary valued polynomial D(x) where each byte contributes eight coefficients to D(x). Bit 0 of each byte is the highest ordered coefficient from each byte. For a write operation, D(x) comprises optional header bytes followed by the data bytes. ECC/remainder generator 100 develops an ECC polynomial $$ECC(x)=D(x)x^{32} \bmod G(x)$$

so that each sector can be written into non-volatile memory 12 as a codeword C(x) where $$C(x)=D(x)x^{32}+ECC(x).$$

Thus, in accordance with the foregoing, step 7-3 depicts the application of 512 bytes of data (preceded by up to 4 bytes of header) to adder $142_3$, one byte per clock. With the application of each bytes, the incoming byte is added (XORed) by adder $142_3$ with the byte currently stored in register $140_3$. Since GATE 144 has been turned on by the ECC signal (see step 7-2), the sum from adder $142_3$ is applied to linear logic data generator 146.

As discussed above, based on the 8 bit pattern inputted thereto, linear logic data generator 146 outputs bytes on its output buses $152_0$–$152_3$. The signals output by linear logic data generator 146 are uniquely determined each clock for each output bus 152. The signal on output buses $152_1$–$152_3$ are applied to input terminals of adders $142_0$–$142_2$, respectively. The signal on output bus $152_0$ is applied to input the terminal of register $140_0$. With each clock, the signals inputted to adders 142 are summed (XORed) and loaded into the respective downstream register 140 (i.e., in FIG. 3 the register positioned to the right or output side of adder 142).

After all data bytes and header bytes have been inputted and operated upon by ECC/remainder generator 100 in the aforedescribed manner (step 7-3), at step 7-4 the signal ECC is turned off by controller 106, indicating that generation of the four ECC bytes is complete. At this point, the four ECC bytes $ECC_3$, $ECC_2$, $ECC_1$, $ECC_0$ reside in registers $140_3$–$140_0$, respectively. Then, at step 7-5, the contents of registers 140 are shifted out as ECC bytes for the sector. In order ECC bytes $ECC_3$, $ECC_2$, $ECC_1$, $ECC_0$ are rightwardly shifted out of registers $140_3$–$140_0$, with byte bit 0 of byte $ECC_3$ first being applied on line 112 to MUX 110 (for outputting to non-volatile memory 12). Thus, the first ECC byte $ECC_3$ comes from the high order end of R(x) and the highest ordered R(x) coefficient in each ECC byte is bit 0 of that byte. As byte $ECC_3$ is shifted out of register $140_3$, the ECC bytes are right shifted so that ECC bytes $ECC_0$, $ECC_1$, $ECC_2$ next reside in registers $140_1$–$140_3$, respectively. Byte $ECC_2$ is next shifted out, followed by bytes $ECC_1$ and $ECC_0$ during successive clock cycles.

Figure 7:
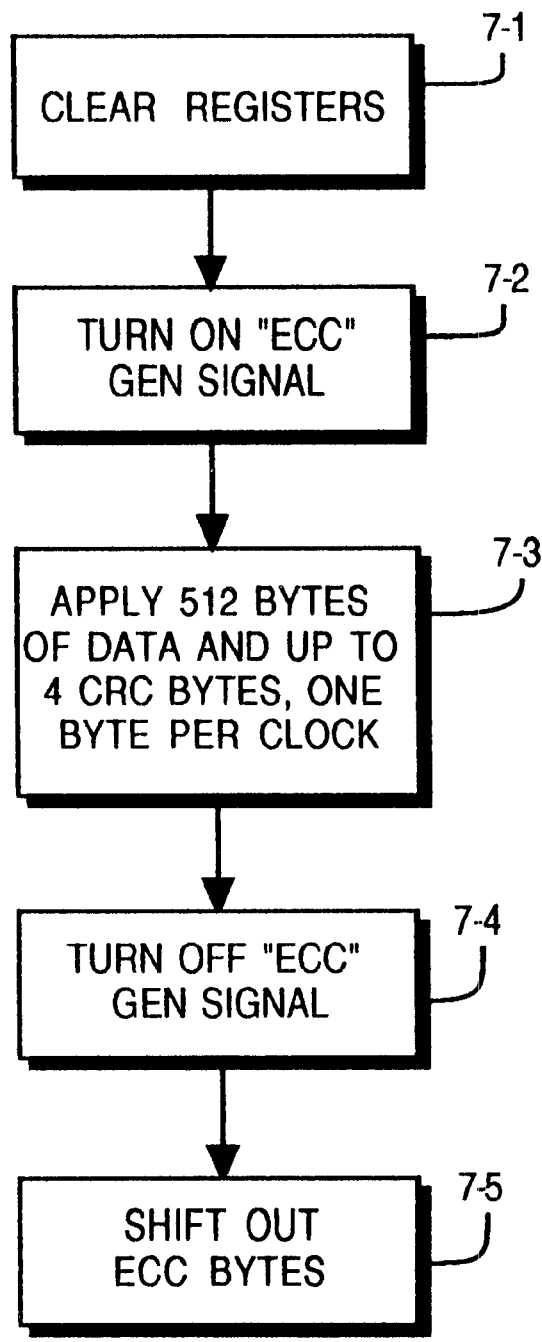
FIG. 7 is a flowchart showing general steps conducted by the error correction system of FIG. 2 in a write operation.

Thus, upon completion of the write operation depicted in FIG. 7, ECC/remainder generator 100 has generated and outputted the four ECC bytes $ECC_3$, $ECC_2$, $ECC_1$, $ECC_0$, which ECC bytes follow the data bytes of the sector in being outputted to non-volatile memory 12.

READ OPERATION

In a read operation (generally depicted in FIG. 8), ECC/remainder generator 100 of error correction system 10 uses the 512 data bytes, 4 header bytes, and 4 ECC bytes to generate 4 bytes of ECC check remainder. The ECC check remainder is used by calculation circuit 104 to generate syndromes $S_1$ and $S_3$. The syndromes $S_1$, $S_3$ are, in turn, used to determine if the sector is error-free, if whether one or two error bits reside in the sector, and either one or two error addresses (L1-64 [complemented] and L2-64 [complemented]) in the sector.

Figure 8:
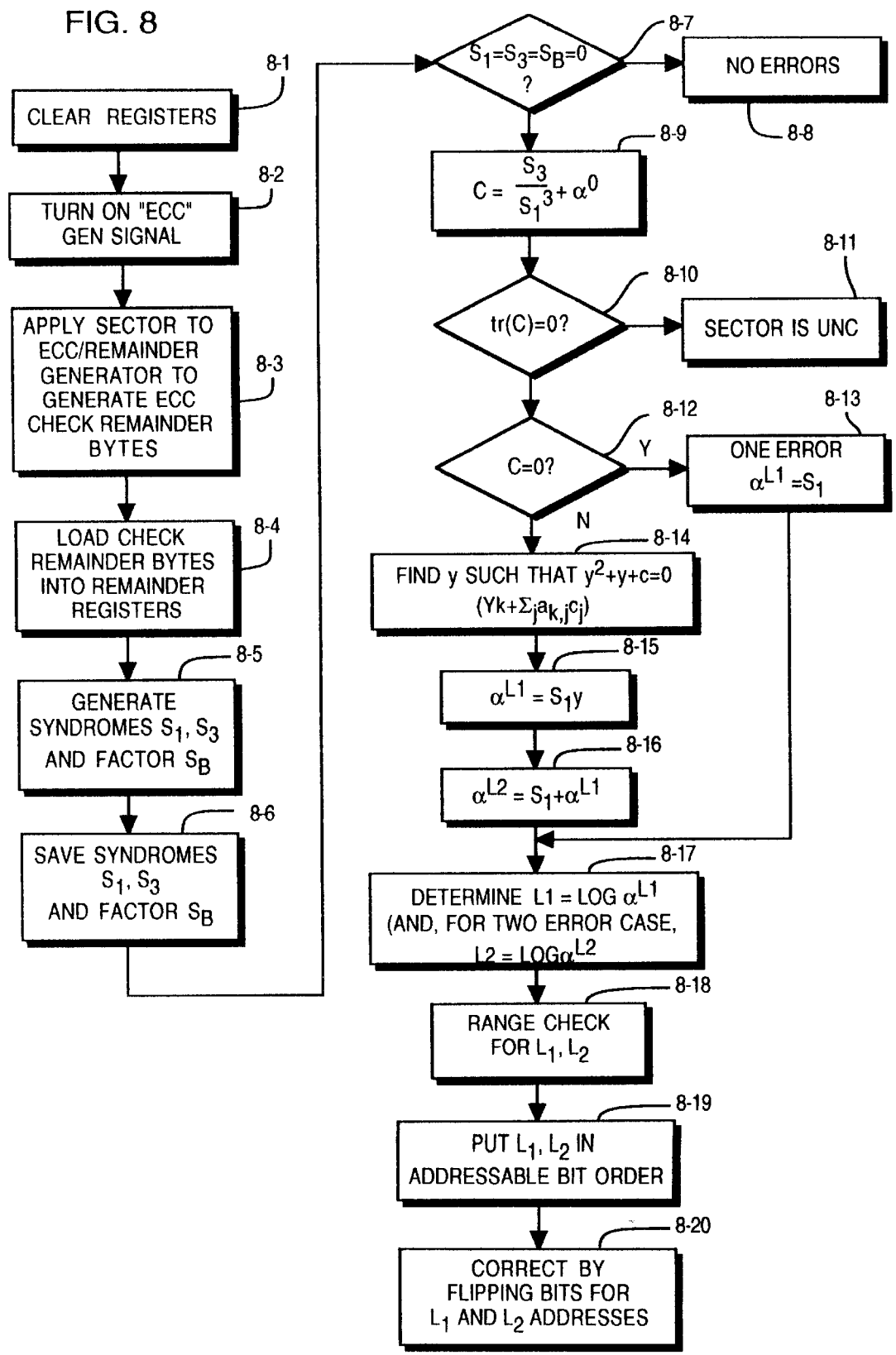
FIG. 8 is a flowchart showing general steps conducted by the error correction system of FIG. 2 in a read operation.

Referring more specifically to the steps of FIG. 8, at step 8-1 all registers of error correction system 10 are cleared. At step 8-2, the "ECC" generation signal is turned on to enable AND gate 144.

At step 8-3, the sector obtained from non-volatile memory 12 is applied, byte-by-byte, to error correction system 10, particularly on line 107 to adder $142_3$. R(x) is the polynomial received in reading a sector, where $$R(x)=C(x)+E(x)$$

in which C(x) is the original sector as intended for storage in non-volatile memory 12 and E(x) is an error polynomial of the received sector. In performing step 8-3, a remainder polynomial REM(x) is obtained where $$REM(x)=R(x)x^{32} \bmod G(x)=E(x)x^{32} \bmod G(x).$$

Thus, at step 8-3, all bytes of the sector, including the ECC bytes, are inputted into ECC/remainder generator 100 at step 8-3. In like manner with syndrome generation described above with reference to step 7-4, an incoming byte on line 107 is added by adder $142_3$ with the contents of register $140_3$, and the sum output (via AND gate 144) to linear logic data generator 146. Using TABLE 1 in the manner previously described, linear logic data generator 146 outputs signals on buses 152. The signal on bus $152_0$ is loaded directly into register $140_0$ the signals on buses $152_1$–$152_3$ are XORed (by adders $142_0$–$142_2$, respectively) with prior contents of upstream registers 140 for generating new values for storage in registers $140_1$–$140_3$, respectively. At the end of step 8-3, registers $140_0$–$140_3$ will contain ECC check remainder bytes $REM_0$, $REM_1$, $REM_2$, $REM_3$.

At step 8-4, the check remainder bytes $REM_0$–$REM_3$ are parallel loaded on buses $116_0$–$116_3$ into remainder registers $102_0$–$102_3$, respectively. Then, at step 8-5, syndromes $S_1$, $S_3$ and factor $S_B$ are generated.

Syndromes $S_1$, $S_3$ and factor $S_B$ are generated as follows:

$$S_1 = R(x)x^{32}|_{x=\alpha} = REM(\alpha)$$

-continued $$S_3 = R(x)x^{32}\mid_{x=\alpha^3} = REM(\alpha^3)$$

$$S_B = REM(x) \bmod (x^4 + 1)$$

In generating the syndromes $S_1$, $S_3$ and factor $S_B$ at step 8-5, syndrome generation AND gate 470 is turned ON and each of the registers 400, 401, and 402 is serially fed the 32 bit value from registers 102 (outputted on line SREG3(0)). For thirty two clocks, the registers 400, 401, and 402 are clocked with feedback. Feedback for register 400 is applied using XOR gate 436A, feedback for register 401 is applied from bit 10 thereof, feedback for register 402 is applied by $\alpha^3$ multiplication provided by alpha multiplier 450. At the end of 32 clocks, the syndromes $S_1$ and $S_3$ reside in registers 400 and 402, respectively, and factor $S_B$ resides in register 401.

At step 8-6, syndrome $S_1$, syndrome $S_3$, and factor $S_B$, having been obtained at step 8-5, are saved for subsequent use by loading into SREG1, SREG3, and SREGB, respectively (see FIG. 4).

At step 8-7, a check is made whether syndrome $S_1$=syndrome $S_3$=factor $S_B$=0. If the check of step 8-7 is affirmative, controller 106 realizes that the sector contains no errors and the error location and correction operation is terminated. Otherwise, processing continues with step 8-9.

At step 8-9, a value "C" is computed as follows:

$$C = \frac{S_3}{S_1^3} + \alpha^0$$

Describing in more detail the computation of "C" by calculation circuit 104, at substep 8-9(1) a n inversion operation is conducted so that 1/S1 is loaded into register 401. In such inversion, register 400 (containing the quantity $S_1$) receives 13 clocks of feedback, after which the inverted quantity results (in $\alpha$ basis representation) in register 401.

After the inversion of substep 8-9(1), at substep 8-9(2), the quantity $1/S_1$ (in $\alpha$ basis representation) is moved into register 402. At substep 8-9(3) the quantity $1/S_1$ is converted to $\beta$ basis representation and ends up in register 400. At substep 8-9(4) the quantity $1/S_1$ in register 400 (in $\beta$ basis representation) is multiplied by the quantity $1/S_1$ (in a basis representation) in register 401, with the product [$1/S_1^2$ in $\beta$ representation] being generated in register 402. Then, at substep 8-9(5), the contents of register 402 [$1/S_1^2$ in $\beta$ representation] is sent to register 400 for a further multiplication (substep 8-9(6)) by the quantity $1/S_1$ (in $\alpha$ basis'representation) in register 401, yielding the product $1/S_1^3$ in $\beta$ representation in register 402. At substep 8-9(7), the contents of register 402 [$1/S_1^3$ in $\beta$ representation] is sent to register 400 and the value stored in register SREG3 (e.g., $S_3$) is loaded into register 401. At substep 8-9(8), the contents of registers 400 and 401 are multiplied so that the product $S_3/S_1^3$ (in $\beta$ representation) is generated in register 402. At substep 8-9(9) the product $S_3/S_1^3$ (in $\beta$ representation) is moved to register 400 and $\alpha^0$ (1) added thereto, so that the above expression for "C" is in register 400.

At step 8-10 a determination is made whether the trace ("tr") of "C" is zero. The determination of step 8-10 is taken by adding together bits 4 and 8 of "C" as stored in register 400. If the trace of "C" is zero, then controller 106 outputs a signal (at step 8-11) advising that the sector is uncorrectable.

Assuming that the trace of "C" is not zero, at step 8-12 a check is made whether the value of "C" is zero. If the value of "C" is zero, controller 106 realizes (represented by step 8-13) that there is only one error in the sector, and that the position of the error ($\alpha^{L1}$) is syndrome $S_1$.

If C is not equal to zero, controller 106 realizes that the sector has two errors (which have locations $\alpha^{L1}$ and $\alpha^{L2}$). Prior to determining the error location values $\alpha^{L1}$ and $\alpha^{L2}$, it is necessary to find a y such that $$y^2 + y + C = 0.$$

At step 8-14, the bits of y are obtained by taking a linear combination as follows:

$$y_k = \sum_j a_{k,j} c_j$$

In taking the linear combination at step 8-14, it will be remembered that "C" is stored in register 400. Accordingly, in order to take the linear combination, for each clock iteration a suitable value for "$a_{k,j}$" must be loaded into register 401. The values for "$a_{k,j}$" are obtained from LIN 440. The particular values for "$a_{k,j}$" outputted from LIN 440 are understood with reference to TABLE 2. For example, the last column of TABLE 2 is outputted for $a_{0,j}$, with the top bit of the last column being $a_{0,0}$. For $a_{1,j}$, the next-to-the-last column of TABLE 2 is outputted, and so forth for each of the 14 summations which form the total sum for "y". The linear combination for y (in $\alpha$ basis representation) is generated in register 402.

With y having been determined at step 8-14, at step 8-15 calculation circuit 104 can proceed to calculate $\alpha^{L1}$ in the case of two errors in the sector. In particular, in the case of two errors, $\alpha^{L1}$ is as indicated by step 8-15:

$$\alpha^{L1} = S_1 y.$$

Of course, in the case of one error, $\alpha^{L1}$ has been determined to be $S_1$ (as determined above—see steps 8-12 and 8-13). In the case of one error, $S_1$ is moved into register 402.

In connection with step 8-15, at substep 8-15(1) syndrome $S_1$ (in $\beta$ representation) is moved into register 400. The value y (in $\alpha$ basis representation) is moved into register 401. Then, at substep 8-15(2), registers 400 and 401 are multiplied together, with the result $\alpha^{L1} = S_1 y$ (in $\beta$ representation) being produced in register 402. At substep 8-15(3), $\alpha^{L1} = S_1 y$ is saved in register SREG3 (see FIG. 4).

Step 8-16 involves the determination of $\alpha^{L2}$. In particular, $\alpha^{L2} = S_1 + \alpha^{L1}$. Accordingly, at substep 8-16(1), syndrome $S_1$ is copied from register SREG1 into register 401. At substep 8-16(2), registers 401 and 402 are added together, so that the result $\alpha^{L2} = S_1 + \alpha^{L1}$ is obtained (in $\beta$ representation) in register 402. At substep 8-16(3), the result $\alpha^{L2} = S_1 + \alpha^{L1}$ is stored in register 400.

Thus, upon completion of steps 8-15 and 8-16 for the two bit error case, values for $\alpha^{L1}$ and $\alpha^{L2}$ have both been determined. At step 8-17, L1 and (for the two error case) L2 are determined by determining $\log \alpha^{L1}$ and $\log \alpha^{L2}$. Details of this log determination are understood with the log operation discussed in more detail with reference to FIG. 10.

As a result of the log determination(s) of step 8-17, for each error bit a 14-bit address value is ultimately obtained. Only 12 bits of the address are used, with bits 4–11 of the address value indicating the erroneous byte of the sector and bits 0–3 of the address value indicating the erroneous bit within the erroneous byte.

At step 8-18 controller 106 checks the values of L1 and L2 in proper bit address order to determine if the sector is correctable and to provide status information as to whether the error bits are in data on the one hand or in ECC or header on the other hand. In conducting the check, controller 106 uses both the factor $S_B$ (generated along with the syndromes) and the values L1 and L2. In particular, controller 106 looks at the least significant bits of L1 and L2 to determine a correspondence with factor $S_B$. In this regard, for the one error case, controller 106 determines whether $S_B$ equals $x^{L1 mod 4}$. For the two error case, controller 106 checks to ensure that $S_B$ equals $x^{L1 mod 4} + x^{L2 mod 4}$.

To be useful for actual addressing, the values for L1 and L2 obtained at step 8-17 should be put in proper bit order. Accordingly, at step 8-19 L1 and L2 are put in proper bit order by conducting a complement of registers that have L1 and L2 stored therein.

Upon determination of the usable error address(es) at step 8-19, at step 8-20 controller 106 directs that the error bit(s) pointed to by values L1-64 [complemented](and value L2-64 [complemented] in the two error case) be flipped. If the erroneous bit pointed to by address L1 were a "1", then controller 106 directs that the bit be flipped in memory 12 to a "0" which, of course, is the only other value the bit can have. A similar correction occurs for the bit located by address L2 in the two error case.

OPERATION: LOGARITHMIC DETERMINATION

Figure 10:
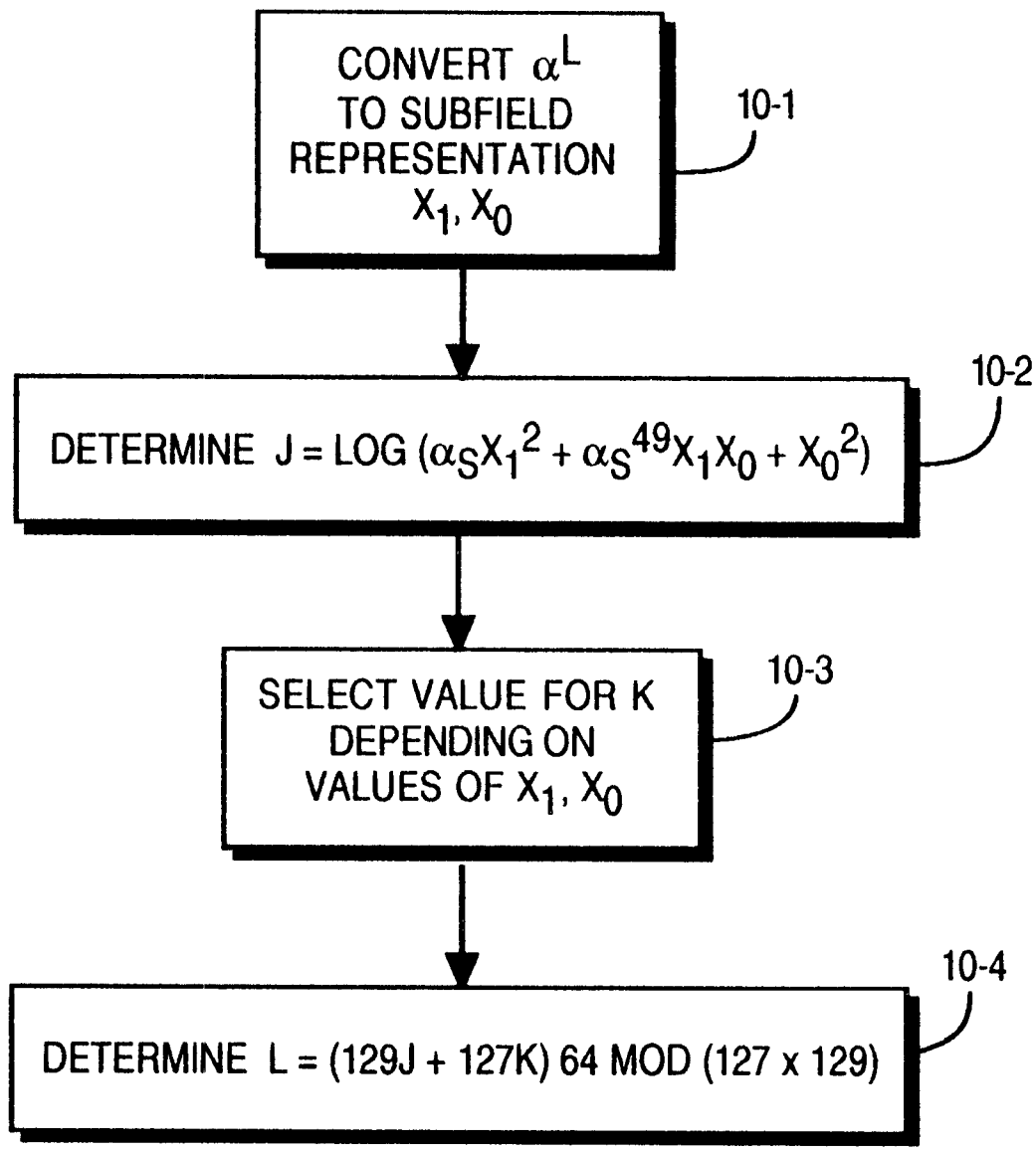
FIG. 10 is a flowchart showing general steps conducted in a logarithmic determination operation included in the read operation of the error correction system of FIG. 2.

General steps shown in connection with determining the log of error location values $\alpha^{L1}$ and $\alpha^{L2}$ are depicted in FIG. 10. Rather than showing the log determination for $\alpha^{L1}$ and $\alpha^{L2}$ separately, FIG. 10 shows steps for determining the log of a representative error locator value $\alpha^L$ (which could be either $\alpha^{L1}$ or $\alpha^{L2}$).

Logarithmic determinations typically involve consultation of a look-up table stored, e.g., in a memory. In view of the fact that determination of the log of a 14 bit quantity such as $\alpha_L$ would involve consultation of an extremely large look-up table, at step 10-1 the present invention converts the error location value $\alpha^L$ into its subfield representation, i.e., the two 7-bit elements $x_1$ and $x_0$. Thereafter, as depicted by step 10-2, the error correction system 10 determines the value J, where $$J = \log(\alpha_s x_1^2 + \alpha_s^{49} x_1 x_0 + x_0^2).$$

Then, at step 10-3, a value for K is selected depending on the values of $x_1$, $x_0$. Using the values, of J and K as determined at steps 10-2 and 10-3, at step 10-4 the sought value L is determined as follows:
ti L=(129J+127K)64mod(127×129).

Figure 11:
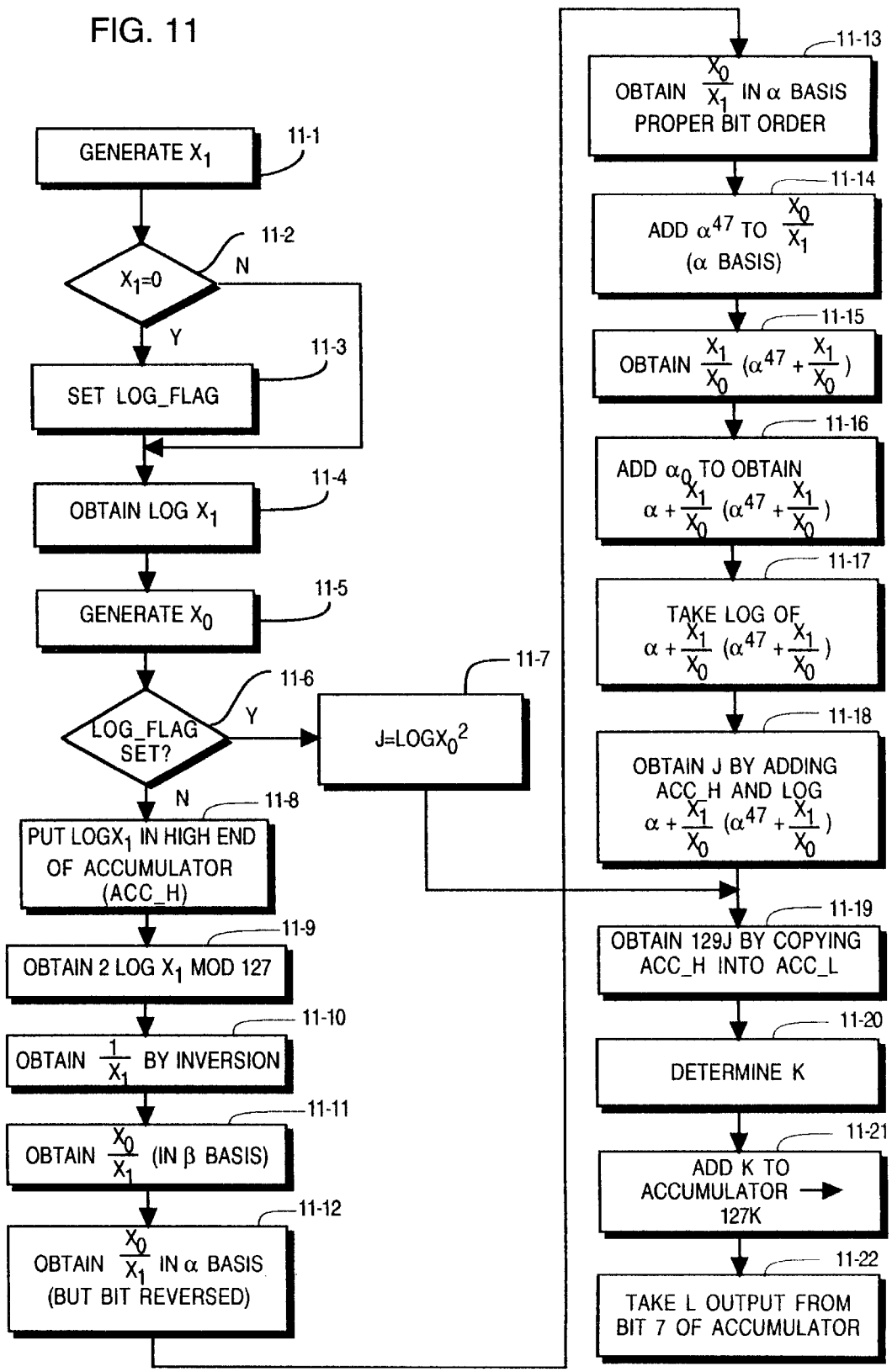
FIG. 11 is a flowchart showing more detailed steps conducted in a logarithmic determination operation included in the read operation of the error correction system of FIG. 2.

Discussed now in more detail and with reference to FIG. 11 is the particular operation of calculation circuit 104 in implementing the steps of FIG. 10 for evaluating the log of the error location value. The conversion of $\alpha^L$ to its subfield representation as depicted by step 10-1 involves using field generator $$F_s(x) = x^2 + \alpha_s^{49} x + \alpha_s$$

with coefficients from $GF(2^7)$ whose field generator is $$x^7 + x^5 + x^3 + x + 1$$

and where $\alpha_s$ is a primitive element of $GF(2^7)$. The address $\alpha^L$ can be converted from its full field representation to its subfield representation which consists of the pair of elements $x_1$, $x_0$, from $GF(2^7)$. The bits of $x_1$, $x_0$ are obtained by taking linear combinations of bits of $\alpha^L$. As in the linear combination for producing "y" as discussed above (see step 8-14), LIN 440 is involved in the linear combination for determining the subfield elements $x_1$, $x_0$.

Initially calculation circuit ensures that $\alpha^{L1}$ resides in register 400 so that the linear combination operation can begin. Then, at substep 10-2, LIN 440 is controlled to output a sequence of 14-bit values that can be used in the linear combination with $\alpha^{L1}$ to generate $x_1$ and $x_0$.

TABLE 3 shows the 14-bit values outputted to register 401 for substep 10-2 to generate subfield values $x_1$ and $x_2$ for the illustrated example. Register 401 gets a different 14 bit value (different column from TABLE 3) for each clock of the linear combination. That is, for the first clock of the linear combination the last column of TABLE 3 is utilized, for the second clock the next to the last column is utilized, and so forth. With each linear combination, the output bit IP gets shifted into register 402. After seven clocks, the higher order seven bits of register 402 contains $x_1$ (see step 11-1 of FIG. 1).

As mentioned with respect to step 10-2, calculation circuit 104 is working toward a determination of J, wherein $$J = \log(\alpha_s x_1^2 + \alpha_s^{49} x_1 x_0 + x_0^2) \qquad \text{EQN. 1.}$$

J can also be expressed as follows:

$$J = \log\left(X_1^2\left(\alpha + \alpha^{49}\frac{X_0}{X_1}, +\left(\frac{X_0}{X_1}\right)^2\right)\right) \qquad \text{EQN. 2}$$

$$J = 2\log X_1 + \log\left(\alpha + \alpha^{49}\frac{X_0}{X_1} + \left(\frac{X_0}{X_1}\right)^2\right) \qquad \text{EQN. 3}$$

$$J = 2\log X_1 \bmod 127 + \log\left(\alpha + \frac{X_0}{X_1}\left(\alpha^{49} + \frac{X_0}{X_1}\right)\right) \qquad \text{EQN. 4}$$

Referring to EQN 4, let
TERM1=$2\log x_1 \bmod 127$
TERM2=$X_0/X_1$
TERM3=$(\alpha^{49}+X_0/X_1)$
TERM4=$(X_0/X_1)(\alpha^{49}+X_0/X_1)$
TERM5=$\alpha+(X_0/X_1)(\alpha^{49}+X_0/X_1)$
TERM6=$\log[\alpha+(X_0/X_1)(\alpha^{49}+X_0/X_1)]$
The foregoing term definitions are utilized to explain subsequent operations of calculation circuit 104.

After $x_1$ has been generated at step 11-1 (residing in the higher order bits of register 402), at step 11-2 $x_1$ is sent to controller 106 to determine if $x_1=0$. If $x_1=0$, controller sets a flag LOG_FLAG (step 11-3). Since $x_1=0$, the expression for J (see EQN 1) simplifies to:

$$J = \log x_0^2 \qquad \text{EQN 5.}$$

At step 11-4 the seven higher order bits of register 402 containing $x_1$ are also parallel loaded into LOG RAM 480 for determining $\log(x_1)$. At step 11-42, $\log(x_1)$ is determined with reference to a look-up table in LOG RAM 480. In particular, TABLE 4 shows the seven bit log values for the possible 128 inputs to LOG RAM 480, the first row of TABLE 4 being output for input value 0000000, the second row of TABLE 4 being output for value 0000001, and so forth. If $x_1$ was determined at step 11-2 to be zero, LOG RAM 480 outputs a value of zero for $\log x_1$.

Essentially simultaneously with step 11-4, at the end of the second set of seven clocks of the linear combination, subfield value $x_0$ is generated in the higher order bits of register 402 (step 11-5) and subfield value $x_1$ is shifted into the lower order bits of register 402. Then, if flag LOG_FLAG has not been set (as determined at step 11-6), calculation circuit 104 addresses the more difficult task of determining J according to EQN 4. Otherwise, at step 11-7 calculation circuit 104 resorts to the simplified expression for J set forth in EQN. 5.

At step 11-7, calculation circuit 104 send the subfield element $x_0$ (now in the upper order bits of register 402) to LOG ROM 480. The upper order bits of register 402 are parallel loadable into LOG ROM 480. LOG ROM 480 uses its lookup TABLE 4 in order to find $\log x_0$, and then sends the $\log x_0$ value to accumulator 500H. In order to obtain $\log x_0^2$, accumulator 500H is simply shifted as for a multiplication by two (since $\log x_0^2 = 2\log x_0$).

With reference to accumulator 500, all operations therein which result in a carry out signal cause a "1" to be added to accumulator 500. Accordingly, accumulator 500 is consistently implementing a mod(127×129) operation.

In the event that flag LOG_FLAG is not set, calculation circuit 104 performs steps 11-8 through 11-20 as shown in FIG. 11.

As shown in step 11-8, the value of $\log(x_1)$ as determined at step 11-4 is sent to the high end (bits 7–13) of accumulator 500 (i.e., to accumulator 500H).

At step 11-9, TERM1 is obtained in accumulator ACC H (i.e., accumulator 500H) by shifting accumulator ACC_H (so as to multiply the contents by two) and, if a bit is shifted out the end of accumulator ACC_H, adding a "1" to the lower order bit of ACC_H. With respect to the $\log x_1$ value put into accumulator ACC_H in step 11-8, the value becomes TERM1 (i.e., $2\log x_1$) upon completion of step 11-9.

At step 11-10 an inversion of $x_1$ (i.e., $1/x_1$) is formed. Upon completion of the linear combination used to generate $x_1$ and $x_0$, the value $x_1$ is in the lower order bits of register 402. In preparation for the inversion of $x_{1,x1}$ is moved into the lower order bits of register SREG1 (see FIG. 4). From register SREG1 the value of $x_1$ is shifted into register 400 for an inversion operation. At step 11-10, an inversion operation is performed for six clocks, followed by six clocks of subfield feedback (using XOR gate 436B). At the end of the twelve clocks of the inversion step 11-10, register 401 contains $1/x_1$ (in alpha representation) in its higher bit end.

When $x_1$ is copied into the lower order bits of register SREG1 (denoted as S1L), $x_0$ is copied from the higher order bits of register 402 into the higher order bits of register SREG1 (denoted as S1H).

Upon completion of step 11-10, calculation circuit is ready at step 11-11 to produce TERM2 (i.e., $X_0/X_1$). Accordingly, $x_0$ is shifted from the higher order bits of register SREG1 into register 400. A multiplication is performed by calculation circuit 104 upon the values in registers 400 and 401, with the product $X_0/X_1$ being output to register 402 (the high order bits) in β representation.

In order to conduct a multiplication to obtain

TERM4=$(X_0/X_1)(\alpha^{49}+X_0/X_1)$ one of the parenthesized factors must be in β basis representation and the other in α basis representation. Thus far calculation circuit 104 has obtained the term $X_0/X_1$, but only in the β basis representation. The term $X_0/X_1$ must also be obtained in the α basis representation in order to conduct the multiplication that yields TERM4. Accordingly, at step 11-12 a β-to-α basis conversion is performed to obtain $X_0/X_1$ in the a basis representation.

Prior to execution of step 11-12, $X_0/X_1$ in the β basis representation is stored in the high end of register 402. During step 11-12, $X_0/X_1$ in the β basis representation is shifted to the lower order end of register 402. Then, using XOR gate 460 for feedback (utilizing bits 1,3,5, and 7 of register 402), register 402 is clocked so as to generate, in its higher order bits, $X_0/X_1$ in the α basis representation (but in bit reversed order). Accordingly, at the end of step 11-12, the lower end (i.e., lower order seven bits) of register 402 has $X_0/X_1$ in the β basis representation and the higher end (i.e., higher order seven bits) of register 402 has $X_0/X_1$ in the α basis representation (but in bit reversed order). As a result of step 11-12, $X_0/X_1$ in the a basis representation has been obtained, but in order to be useful for obtaining TERM3, i.e., TERM3=$(\alpha^{49}+X_0/X_1)$ the bit pattern of factor $X_0/X_1$ must be reversed (since it is stored in the high end of register 402 in bit reversed order). In order to put the factor $X_0/X_1$ (in β basis representation) in the proper bit order, at step 11-13 the feedback to alpha multiplier 450 and register 402 is turned off while, during each of 7 clock cycles, register 402 parallel loads alpha multiplier 450 and the output from multiplier 450 parallel loads register 402. During each clock the contents of bit 13 of register 402 is serially loaded into register 401, with the result that factor $X_0/X_1$ (in α basis representation) in the proper bit order is obtained in register 401. The structure of alpha multiplier 450 for such operation is shown in FIG. 6.

Thus, the operation of step 11-13 is the equivalent of a left shift of register 402, so that bits 13–7 can be read out therefrom in the order of bit 13, bit 12, etc., meaning that the factor $X_0/X_1$ (in α basis representation) is read out in bit order 0, 1, . . . 6. Thus, the factor $X_0/X_1$ (in α basis representation) in proper bit order is read out to register 401 and the factor $X_0/X_1$ (in β basis representation) is shifted to be in the higher order bits of register 402, after which it is moved into register 400.

At step 11-14, controller 106 outputs a value for $\alpha^{47}$ (in a basis representation) which is added to the factor $X_0/X_1$ (in α basis representation). Then, at step 11-15 the multiplication of factors $\alpha^{47}+X_0/X_1$ (in α basis representation in register 400) can be multiplied by the factor $X_0/X_1$ (in β basis representation in register 402) to obtain a product (i.e., TERM4) in register 402 (in β basis representation).

At step 11-16, α is added to TERM4 in order to obtain TERM5, i.e.,

TERM5=$\alpha+(X_0/X_1)(\alpha^{49}+X_0/X_1)$.

To obtain TERM5, controller 106 puts the constant value 010000 in the higher order bits of register 401 and turns on signal FORCE_IP in order to add the contents of register 401 and register 402, resulting in TERM5 being formed in register 401.

With TERM5 having been formed at step 11-16, its log is taken at step 11-17. To do so, TERM5 is loaded into register 402. If flag LOG_FLAG is not on, TERM5 in the higher order bits of register 402 is parallel applied to LOG ROM 480 (see FIG. 5B). LOG ROM 480 uses TABLE 4 as look-up values for generating a logarithmic output corresponding to the input signal. As a result of step 11-17, TERM6, i.e., TERM6=$\log[\alpha+(X_0/X_1)(\alpha^{49}+X_0/X_1)]$ is outputted from LOG ROM 480.

At step 11-18 TERM6 (outputted from LOG ROM 480 at step 11-14) is added to

TERM1=$2\log x_1 \bmod 127$ which is stored in ACC_H (i.e., accumulator 500H), thereby yielding the sought value J.

As indicated by the expression for L, i.e.,

L=(129J+127K)64mod(127×129)

J (now in ACC_H) must be multiplied by 129. Thus, whether J was obtained at step 11-18 (for $x_1 \neq 0$) or at step 11-7 (for $x_1=0$), this multiplication occurs at step 11-19. In particular, it will be understood that multiplication of a value by 129 is the same as multiplication by 128 and adding the product to the original value. To accomplish such, at step 11-19 the value of J in ACC_H (i.e., register 500H) is copied into register ACC_L (i.e., register 500L), so that the composite register 500 has 129J.

The value of J is just one factor needed to determine the value L. As indicated previously with respect to step 10-3, another value needed for the determination of L is "K".

At step 11-20, K is determined in accordance with the following:

$$K = 0 \text{ if } x_1 = 0$$
$$1 \text{ if } x_1 \neq 0 \text{ and } x_0 = 0$$
$$f(x_0/x_1) \text{ if } x_1 \neq 0 \text{ and } x_0 \neq 0$$

where $f(x_0/x_1)=\log(y_1\alpha+y_0)$ where log is of base $\alpha$ and is obtained with a lookup table and $y_1$, $y_0$ are the unique pair of elements from $GF(2^7)$ such that $\log(y_1\alpha+y_0)<129$ and $y_0/y_1=x_0/x_1$.

Such a $y_1$, $y_0$ pair exists for every $x_1,x_0$ pair where $x_1 \neq 0$ and $x_0 \neq 0$.

If K=0 as determined at step 11-16, the computation of L has essentially been completed (L=129J, which resides in register 500 after step 11-16).

If $x_1$ is not equal to 0, then LOG ROM 480 is used to generate $f(x_0/x_1)$ as described above. K will be the output of LOG ROM 480 if 0<K<128. The output for LOG ROM 480 for K is shown in TABLE 5. TABLE 5, like TABLE 4, is listed for all 128 inputs (in increasing input value order beginning at 0, the values being consecutive arranged in columns and continuing from the bottom of one column to the top of the next as shown in TABLE 4 and TABLE 5).

At step 11-21, K is multiplied by 127. Step 11-21 capitalizes upon the fact that 127×K=128K−K. Accordingly, multiplication at step 11-18 is done by adding K to the higher order end of accumulator 500 (i.e., ACC_H, which already contains J) and subtracting K from the lower order end of accumulator 500 (i.e., ACC_L). In connection with the subtraction, the seven bit value for K is front loaded with seven zeros, which quantity is complemented by inversion gate 490 (i.e., ones are changes to zeros and zeros are changed to ones). The entire fourteen bit complemented value is added to accumulator 500 to accomplish substraction by K. Thus, at the end of step 11-21, accumulator 500 has (129J+127K)mod(127×129). The term mod(127×129) is included in accumulator 500 because, as mentioned before, for all operations resulting in a carry out, a "1" is added to accumulator 500.

At step 11-22, output for L is taken from bit seven, which is tantamount to multiplication by 64. Accordingly, it can now be seen that the desired value L·64 [complemented] as been obtained. The reason for the subtraction (accomplished by the above operations) is to remove 32 bits of ECC and 32 bits of premultiplication.

It will be understood that, in connection with a case of two errors in a sector, the steps of FIG. 11 are preformed for each error. Thereafter, as indicated by step 8-18, a range check is performed upon the L values (e.g., L1 and L2); the L values are put in usable addressing order (step 8-19); and correction is performed on the bits having the addresses L1 (and L2 in the two error case) determined by error correction system 10.

While the preferred embodiment has been disclosed and described in detail herein, it will be obvious to those skilled in the art that various changes in form and detail may be made therein without departing from the spirit and scope thereof.

TABLE 1

LINEAR LOGIC DATA TABLE

| | | | |
|---|---|---|---|
| 00001001 | 11000000 | 10010000 | 10000101 |
| 00010011 | 10000001 | 00100001 | 00001010 |
| 00100111 | 00000010 | 01000010 | 00010100 |
| 01001110 | 00000100 | 10000100 | 00101000 |
| 10011100 | 00001001 | 00001000 | 01010000 |
| 00110001 | 11010010 | 10000000 | 00100101 |
| 01100011 | 10100101 | 00000000 | 01001010 |
| 11000111 | 01001010 | 00000000 | 10010100 |

TABLE 2

LIN OUTPUT VALUES FOR LINEAR COMBINATION TO GENERATE y 01101000101110
00111010111100
00111010111110
11111000111100
01010010010100
10110101100000
11111000110110
00101111000000
10010000000010
11001010011000
10010000111000
00111111110100
11010110100100
01011010011100

TABLE 3

LIN OUTPUT VALUES FOR LINEAR COMBINATION TO GENERATE SUBFIELD ELEMENTS $x_1$ AND $x_0$ 10000000000000
00000001000000
01000001110010
01110011101001
01101001000001
01000000100010
00100010110101
00110100111011
10111010010010
00010011011111
01011110010011
00010011001001
01001001001000
11001000000001

TABLE 4

LOGARITHMIC LOOK-UP TABLE FOR LOG ROM

| | | | |
|---|---|---|---|
| 0000000 | 0000011 | 0000010 | 0010111 |
| 1111110 | 1010011 | 0011101 | 1110000 |
| 0010011 | 1010101 | 1100100 | 1100111 |
| 1111101 | 1011101 | 1010010 | 0110110 |
| 0010010 | 1000100 | 1010100 | 1110001 |
| 0000110 | 0100001 | 1010110 | 1101000 |
| 0100111 | 1011011 | 0100010 | 1101001 |
| 1111100 | 0111001 | 1011100 | 1101010 |
| 0101011 | 0001001 | 0001010 | |
| 0010001 | 0111110 | 1000011 | |
| 0000101 | 1001000 | 0100000 | |
| 0111011 | 1000010 | 1110110 | |
| 1001010 | 0011111 | 0110011 | |
| 0100110 | 0100100 | 1011010 | |
| 1111011 | 0001100 | 0111000 | |
| 0011010 | 1110101 | 1110011 | |
| 0101010 | 1001110 | 0010101 | |
| 0101110 | 0110010 | 0001000 | |
| 1100001 | 1011001 | 0111101 | |
| 0010000 | 1111001 | 1001100 | |
| 0000100 | 0011000 | 0110000 | |
| 1011110 | 0110111 | 1000111 | |
| 1000101 | 1110010 | 1000001 | |
| 0111010 | 1101011 | 1101110 | |
| 0111111 | 0000000 | 0011110 | |
| 1001001 | 0010100 | 1100101 | |
| 0100101 | 0000111 | 1010111 | |
| 0001101 | 0101000 | 0100011 | |
| 1001111 | 0101100 | 0001011 | |
| 1111010 | 0111100 | 1110111 | |
| 0011001 | 1001011 | 0110100 | |
| 1101100 | 0011011 | 1110100 | |
| 0000001 | 0101111 | 0010110 | |
| 0101001 | 1100010 | 1001101 | |
| 0101101 | 1011111 | 0110001 | |
| 0011100 | 1000110 | 1101111 | |
| 1100011 | 1000000 | 1100110 | |
| 1100000 | 0001110 | 1011000 | |
| 0001111 | 1010000 | 1111000 | |
| 1010001 | 1101101 | 0110101 | |

TABLE 5

FUNCTION LOOK-UP TABLE FOR LOG ROM

| | | | |
|---|---|---|---|
| 0000001 | 1011000 | 0100000 | 0101111 |
| 0110100 | 0010001 | 1110101 | 1110111 |
| 1100111 | 0111001 | 0010101 | 1111111 |
| 1110010 | 1100010 | 1101011 | 0111011 |
| 1011010 | 0010000 | 1000001 | 0011010 |
| 0111100 | 1001111 | 1000010 | 0001111 |
| 0100001 | 0110001 | 1011110 | 0000000 |
| 0000111 | 0011101 | 0011011 | 1001101 |
| 1010001 | 1010100 | 1001110 | 1100000 |
| 0110101 | 1101101 | 0101010 | 1111010 |
| 1001010 | 0001110 | 0101011 | 0100111 |
| 0100101 | 0011000 | 0000100 | 1000101 |
| 0110110 | 0001011 | 1001000 | 0110111 |
| 0011001 | 1111001 | 0011111 | 1011100 |
| 0111000 | 1010101 | 0101101 | 0110100 |
| 0100010 | 0001001 | 1110000 | 1001100 |
| 1100011 | 1000100 | 1010000 | 1001001 |
| 1111110 | 0010010 | 1100100 | 1011111 |
| 0111110 | 1000111 | 1110010 | 1001011 |
| 0100110 | 1010011 | 0110010 | 1101000 |
| 1111011 | 1101100 | 1110011 | |
| 1011001 | 0010110 | 1101001 | |
| 1011101 | 1100001 | 0101101 | |
| 0010111 | 0001100 | 0010100 | |
| 1111100 | 0100011 | 1000011 | |
| 0011100 | 1100110 | 1011011 | |
| 1110100 | 1000000 | 0011110 | |
| 1101110 | 0111111 | 0000011 | |
| 0000010 | 0101100 | 0100100 | |

TABLE 5-continued

FUNCTION LOOK-UP TABLE FOR LOG ROM

| | | |
|---|---|---|
| 1000110 | 1111000 | 1101010 |
| 1010010 | 1110110 | 0000110 |
| 0001010 | 0001000 | 0101000 |
| 1010110 | 0111010 | 0001101 |
| 1111101 | 0101110 | 0010011 |
| 0110011 | 0111101 | 0000101 |
| 1010111 | 1101111 | 1100101 |

The embodiments of the invention in which an exclusive property or privilege is claimed are defined as follows:

1. A solid state disk drive for emulating the operation of a magnetic disk drive, comprising:

(a) a disk controller for providing a magnetic disk interface to a host system;

(b) a solid state disk drive emulator responsive to the disk controller for translating the magnetic disk commands into compatible solid state commands;

(c) an array of solid state memory devices for storing non-volatile computer data in a manner to provide emulated sectors; and (d) an error correcting system, responsive to the array of solid state memory devices, capable of correcting up to two bit errors per emulated sector, the error correcting system employing a polynomial code generator to correct the up to two bit errors regardless of whether the up to two bit errors are caused by defective or discharged cells in the memory array.

2. A solid state disk drive for emulating the operation of a magnetic disk drive, comprising:

(a) a disk controller for providing a magnetic disk interface to a host system;

(b) a solid state disk drive emulator responsive to the disk controller for translating the magnetic disk commands into compatible solid state commands;

(c) an array of solid state memory devices for storing non-volatile computer data, the solid state memory array being configured in rows and columns of memory cells, the rows representing tracks of a magnetic disk and the columns comprising sectors; and (d) an error correcting system, responsive to the array of solid state memory devices, capable of correcting up to two bit errors in a sector caused by defective or discharged cells in the memory array.

3. The solid state disk drive as recited in claim 2, wherein the solid state memory array comprises Flash EEprom memory.

4. The solid state disk drive as recited in claim 2, wherein the error correcting system employs a bit oriented code that processes a byte at a time.

5. The solid state disk drive as recited in claim 1, wherein the code generator polynomial is of length 32.

6. The solid state disk drive as recited in claim 1, wherein the code generator polynomial yields two syndromes.

7. The solid state disk drive as recited in claim 6, wherein the two syndromes are employed by the error correction system to determine either one or two error bit positions in the sector.

8. The solid state disk drive as recited in claim 7, wherein the code generator polynomial yields a check factor.

9. The solid state disk drive as recited in claim 8, wherein the check factor is used to confirm the either one or two error bit positions in the sector.

10. The solid state disk drive as recited in claim 9, wherein a first error bit position in the sector is $\alpha^{L1}$, and wherein for a one error case the error correction system determines whether the check factor equals $x^{L1mod4}$.

11. The solid state disk drive as recited in claim 9, wherein a first error bit position in the sector is OCL and a second error bit position in the sector is $\alpha^{L2}$, and wherein for a two error case the error correction system determines whether the check factor equals $x^{L1mod4}+x^{L2mod4}$.

12. The solid state disk drive as recited in claim 1, wherein the code generator polynomial yields a check factor.

13. A method of emulating the operation of a magnetic disk drive, comprising:
   storing non-volatile computer data in an array of solid state memory devices in a manner to provide emulated sectors;
   reading an emulated sector of non-volatile computer data stored in an array of solid state memory devices;
   employing a polynomial code generator to correct the up to two bit errors regardless of whether the up to two bit errors are caused by defective or discharged cells in the memory array.

14. The method of claim 13, wherein the code generator polynomial is of length 32.

15. The method of claim 13, further comprising using the code generator polynomial to yield two syndromes.

16. The method of claim 15, further comprising employing the two syndromes to determine either one or two error bit positions in the sector.

17. The method of claim 16, further comprising using the code generator polynomial to yield a check factor.

18. The method of claim 17, further comprising using the check factor to confirm the either one or two error bit positions in the sector.

19. The method of claim 18, wherein a first error bit position in the sector is $\alpha^{L1}$ and wherein for a one error case the method further comprises determining whether the check factor equals $x^{L1mod4}$.

20. The method of claim 18, wherein a first error bit position in the sector is αL1 and a second error bit position in the sector is $\alpha^{L2}$ and wherein for a two error case the method further comprises determining whether the check factor equals $x^{L1mod4}+x^{L2mod4}$.

21. The method of claim 13, further comprising using the code generator polynomial to yield a check factor.

* * * * *